United States Patent [19]
Kobayashi

[11] Patent Number: 6,054,889
[45] Date of Patent: Apr. 25, 2000

[54] MIXER WITH IMPROVED LINEAR RANGE

[75] Inventor: Kevin W. Kobayashi, Torrance, Calif.

[73] Assignee: TRW Inc., Redondo Beach, Calif.

[21] Appl. No.: 08/967,412

[22] Filed: Nov. 11, 1997

[51] Int. Cl.[7] .................................................. G06F 7/44
[52] U.S. Cl. .......................... 327/357; 327/359; 455/333
[58] Field of Search .......................... 327/116, 119–122, 327/356, 357, 359; 455/333

[56] References Cited

U.S. PATENT DOCUMENTS

| | | | |
|---|---|---|---|
| 3,689,752 | 9/1972 | Gilbert | 327/357 |
| 4,963,767 | 10/1990 | Sinh | 326/126 |
| 4,965,528 | 10/1990 | Okanobu | 330/252 |
| 5,057,716 | 10/1991 | Kung | 327/358 |
| 5,115,409 | 5/1992 | Stepp | 708/835 |
| 5,144,174 | 9/1992 | Murakami | 327/277 |
| 5,311,086 | 5/1994 | Yamaji et al. | 327/356 |
| 5,389,840 | 2/1995 | Dow | 327/357 |
| 5,414,383 | 5/1995 | Cusdin et al. | 327/357 |
| 5,442,311 | 8/1995 | Trafton | 327/306 |
| 5,489,878 | 2/1996 | Gilbert | 331/57 |
| 5,532,637 | 7/1996 | Khoury et al. | 327/359 |
| 5,548,840 | 8/1996 | Heck | 455/326 |
| 5,589,791 | 12/1996 | Gilbert | 327/359 |

OTHER PUBLICATIONS

Barrie Gilbert, "Design Considerations for BJT Active Mixers", Rev. 2.2, Dtd: Sep. 4, 1994.

Primary Examiner—Kenneth B. Wells
Attorney, Agent, or Firm—Michael S. Yatsko

[57] ABSTRACT

A wide dynamic range bilinear multiplier implemented with an improved Gilbert cell mixer topology linearizies the top quad core of transistors Q1, Q2, Q3 and Q4 to provide a true bilinear multiplier whose output is linearly related to both inputs over a relatively substantial input power range without the need for an additional diode predistortion circuit or increased voltage. In order to improve the linearity of the upper quad core of transistors Q1, Q2, Q3 and Q4, these transistors Q1, Q2, Q3 and Q4 are implemented as either multi-tanh doublets or multi-tanh triplets. Each multi-tanh doublet includes two pair of common emitter configured transistors $Q_{xe}$ and $Q_{xae}$. The linear input voltage range of the multi-tanh doublets is maximized by proper selection of the emitter areas $Q_{xae}$ relative to $Q_{xe}$, where Ae is an area factor greater than 1. Each of the multi-tanh doublets is connected to the mirror current driver, formed from a pair of common emitter connected transistors, which act as current sinks for each of the multi-tanh doublets. In alternate embodiment of the invention, the upper transistor quad core transistors, Q1, Q2, Q3 and Q4 are formed from two multi-tanh triplets. An additional transistor is added to each of the multi-tanh doublets to form the multi-tanh triplets. In addition, another transistor is added to each of the mirror current driver circuits for each of the multi-tanh triplets. The use of the multi-tanh doublets and multi-tanh triplets allow the linear range of the upper quad transistor core transistors Q1, Q2, Q3 and Q4 to extended without the use of additional diode predistortion circuits or other performance penalties.

13 Claims, 26 Drawing Sheets

$A_e$ = A times the unit emitter area e

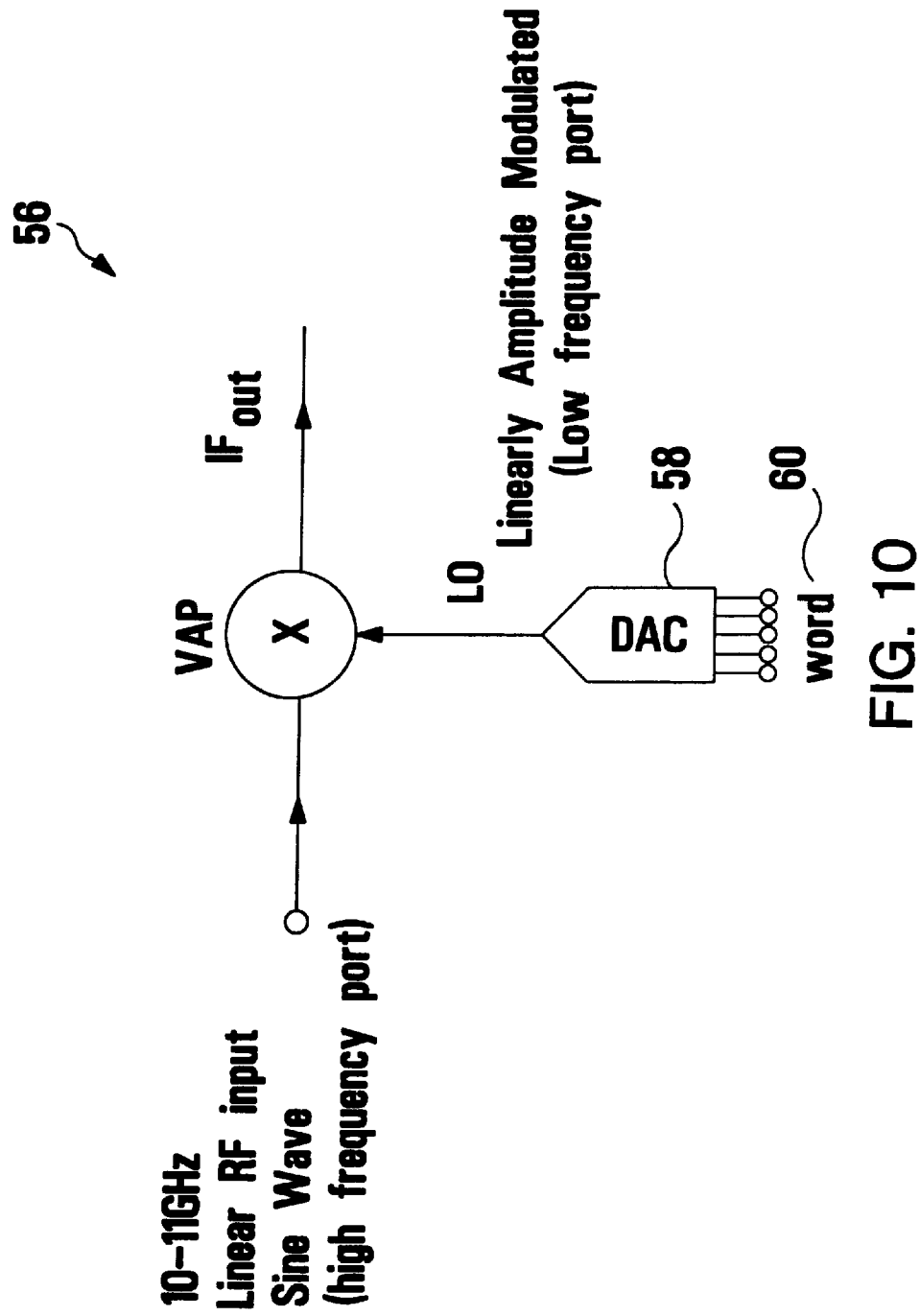

MIXER WITH IMPROVED LINEAR RANGE

BACKGROUND OF THE INVENTION

1. Field of the Invention

The present invention relates to a wide dynamic range bilinear multiplier and more particularly, to a bilinear multiplier or mixer configured in an improved Gilbert topology which provides an increased linear range relative to known Gilbert mixers which obviates the need for an additional predistortion stage without sacrificing the phase or broadband performance properties of the mixer.

2. Description of the Prior Art

Mixers are used in various applications, such as frequency conversion and bilinear signal multiplication applications. Many known RF systems typically use mixers for RF receiver applications for upconverting and downconverting the RF signals. In such applications, an oscillator is used to provide a local oscillator (LO) source frequency that is amplified by an LO buffer amplifier to a signal level large enough to switch diodes or transistors in the mixer. A relatively small level RF signal is applied to the other input of the mixer to be frequency converted. The output of the mixer is the difference and sum of the frequencies of the input signals. In such an application, the LO port is driven into saturation where the noise figure, conversion gain and IP3 typically improve with a larger LO drive level.

Mixers are also known to be used in another application in order to modulate a digital data stream of 1's and 0's onto a carrier frequency. In this application, the LO port is driven non-linearly. In both cases discussed above, a linear relationship is not required between the output and both of the inputs to the mixer. However, there are applications in which both input ports to the mixer need to be linearly related to the output port, such as in variable amplitude and phase (VAP) control circuits, which typically use a Gilbert cell mixer. Such applications are typically used for higher order modulation schemes, such as OPSK and 16 QAM applications and typically require increasing the linear input power range of the LO port of the mixer using circuit modifications to the basic mixer cell. However, for many mixers, especially active mixer topologies, such as the Gilbert cell, it is relatively complicated to increase the linear range of the device.

A typical Gilbert cell is illustrated in FIG. 1A. The mixer is named after its inventor and is described in detail in "DESIGN CONSIDERATIONS FOR BJT ACTIVE MIXERS", by Barrie Gilbert, *Workshop Notes*, Analog Devices, Inc., Rev. 2.2, Sep. 4, 1994 and U.S. Pat. No. 5,589,791, hereby incorporated by reference. Such Gilbert cell mixers include four transistors Q1, Q2, Q3, Q4 (FIG. 1) known as an upper quad core of transistors, Q1, Q2, Q3 and Q4. The upper quad core of transistors Q1, Q2, Q3 and Q4 are differentially connected in a common emitter configuration and in turn connected to a differentially connected pair of transistors Q5 and Q6. As shown in FIG. 1, the Gilbert cell mixer has two input ports $RF_{in1}$, $RF_{in2}$ and one output port OUTPUT.

In operation, when a DC voltage is applied to the input port $RF_{in1}$, a hyperbolic tangent (tanh) function exists between the input port $RF_{in2}$ and the output port OUTPUT as generally shown in FIG. 1B due to the linear transconductance of the transistors Q5 and Q6 for that range. However, the transconductance $G_m$ of transistors Q5 and Q6 becomes increasingly non-linear outside of the linear operating range as shown in FIG. 1B.

Various techniques are known for linearizing the output range of the transistors of Q5 and Q6. For example, as shown in FIG. 1, an emitter degeneration resistor $R_{ee}$ is connected between the emitter terminals of the transistors Q5 and Q6 for linearizing the RF input $RF_{in2}$. In addition, other techniques, such as replacing the emitter degeneration resistor $R_{ee}$ by a near noiseless lossless spiral inductor are also known to be used for achieving high linearity without incurring a thermal noise degradation accompanied by the emitter degeneration resistor. Other techniques for linearizing the transistors Q5 and Q6 are also disclosed in U.S. Pat. No. 5,558,791 and "DESIGN CONSIDERATIONS FOR BJT ACTIVE MIXERS", supra.

One problem with such so called Gilbert mixers, is the need to linearize the upper quad core of transistors Q1, Q2, Q3 and Q4. In order to linearize the upper quad core of transistors Q1, Q2, Q3 and Q4 without incurring excessive bandwidth or noise performance penalties, a conventional diode predistortion circuit, such as illustrated in FIG. 2, is normally utilized. Unfortunately, the diode distortion circuit requires additional DC power, as well as semiconductor real estate and adds thermal noise as generally discussed in "ANALYSIS AND DESIGN OF ANALOG INTEGRATED CIRCUITS," by Paul R. Gray and Robert G. Meyer, Second Edition, John Wiley & Sons, New York, 1984.

Emitter degeneration circuitry is typically not used on the upper transistor quad core Q1, Q2, Q3, Q4 because of the added thermal noise, as well as the degradation in bandwidth due to the higher impedance applied to the collectors of the transistors Q5 and Q6 which causes a higher degree of the Miller effect on the bottom transistors Q5 and Q6. In addition, emitter degradation circuitry results in the loss of voltage headroom and can substantially cause unwanted peaking in the upper quad core of transistors Q1, Q2, Q3 and Q4, which can result in dynamic phase distortion.

U.S. Pat. No. 5,331,086 discloses a linearization technique for the upper quad core of transistors Q1, Q2, Q3 and Q4 of a conventional Gilbert mixer. As disclosed in the '086 patent, the mixer includes common base configured transistors whose terminals are either grounded or connected to a constant voltage source. In particular, the common base transistors are essentially connected between the upper quad transistor core and the transistors Q5 and Q6. With such configuration, a relatively higher voltage supply is required for proper operation.

It is an object of the present invention to solve various problems in the prior art.

It is yet another object of the present invention to provide an improved Gilbert cell mixer which provides an increased linear range.

It is a further object of the present invention to provide an improved Gilbert cell mixer which provides an increased linear range without the need for additional diode predistortion circuitry.

It is yet a father object of the present invention to provide a improved Gilbert cell mixer which provides an increased linear range while allowing for a relatively low supply voltage.

Briefly, the present invention relates to a wide dynamic range bilinear multiplier implemented with an improved Gilbert cell mixer topology which linearizies the top quad core of transistors Q1, Q2, Q3 and Q4 to provide a true bilinear multiplier whose output is linearly related to both inputs over a relatively substantial input power range without the need for an additional diode predistortion circuit or increased voltage. In order to improve the linearity of the upper quad core of transistors Q1, Q2, Q3 and Q4, these transistors Q1, Q2, Q3 and Q4 are implemented as either multi-tanh doublets or multi-tanh triplets. Each multi-tanh doublet includes two pair of common emitter configured transistors $Q_{xe}$ and $Q_{xae}$. The linear input voltage range of the multi-tanh doublets is maximized by proper selection of the emitter areas $Q_{xae}$ relative to $Q_{xe}$, where Ae is an area factor greater than 1. Each of the multi-tanh doublets is connected to a mirror current driver, formed from a pair of common emitter connected transistors, which act as current sinks for each of the multi-tanh doublets. In an alternate embodiment of the invention, the upper transistor quad core transistors, Q1, Q2, Q3 and Q4 are formed from two multi-tanh triplets. An additional transistor is added to each of the multi-tanh doublets to form the multi-tanh triplets. In addition, another transistor is added to each of the mirror current driver circuits for each of the multi-tanh triplets. The use of the multi-tanh doublets and multi-tanh triplets allow the linear range of the upper quad transistor core transistors Q1, Q2, Q3 and Q4 to extended without the use of additional diode predistortion circuits or other performance penalties.

DESCRIPTION OF THE DRAWINGS

These and other objects of the present invention will be readily understood with reference to the following specification and attached drawing, wherein:

FIG. 10 is a block diagram a variable amplitude and phase (VAP) bilinear multiplier application.

FIG. 13D is a graphical illustration of the broadband conversion gain for various LO dc input voltage amplitude for the circuit illustrated in FIG. 13a.

DETAILED DESCRIPTION

The present invention relates to an improved Gilbert cell topology and a dynamic range bilinear multiplier which provides improved linearity of the upper quad core transistors Q1, Q2, Q3 and Q4. As discussed above, various techniques are utilized for improving the linearity of the lower transistors Q5 and Q6. However, known techniques for improving linearity characteristics of the upper quad transistors Q1, Q2, Q3 and Q4 either involve additional diode predistortion circuits which require additional power, semiconductor real estate or the addition of common base transistors which require an increased operating voltage for the device. The present invention obviates the need for additional diode predistortion circuits and common base transistors by utilizing multi-tanh doublets and triplets. With such a configuration, by linearizing the top transistor quad core, a true bilinear multiplier is provided whose input is linearly related to both input over a substantial input power range.

Figure 1B:
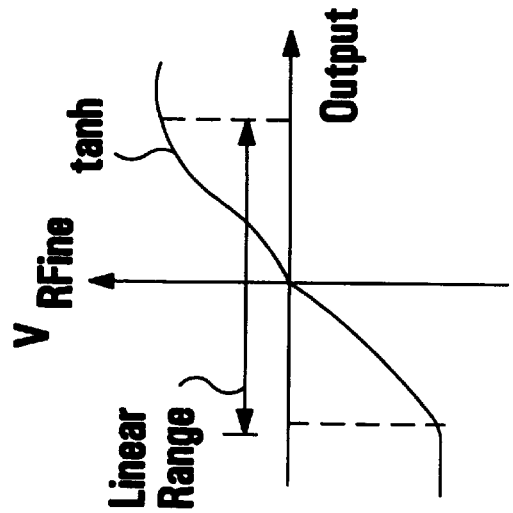
FIG. 1B is a graphical illustration illustrating the hyperbolic tangent relationship between the input RF and the output of the Gilbert cell mixer illustrated in FIG. 1A and also illustrating the linear operating range.
Figure 1A:
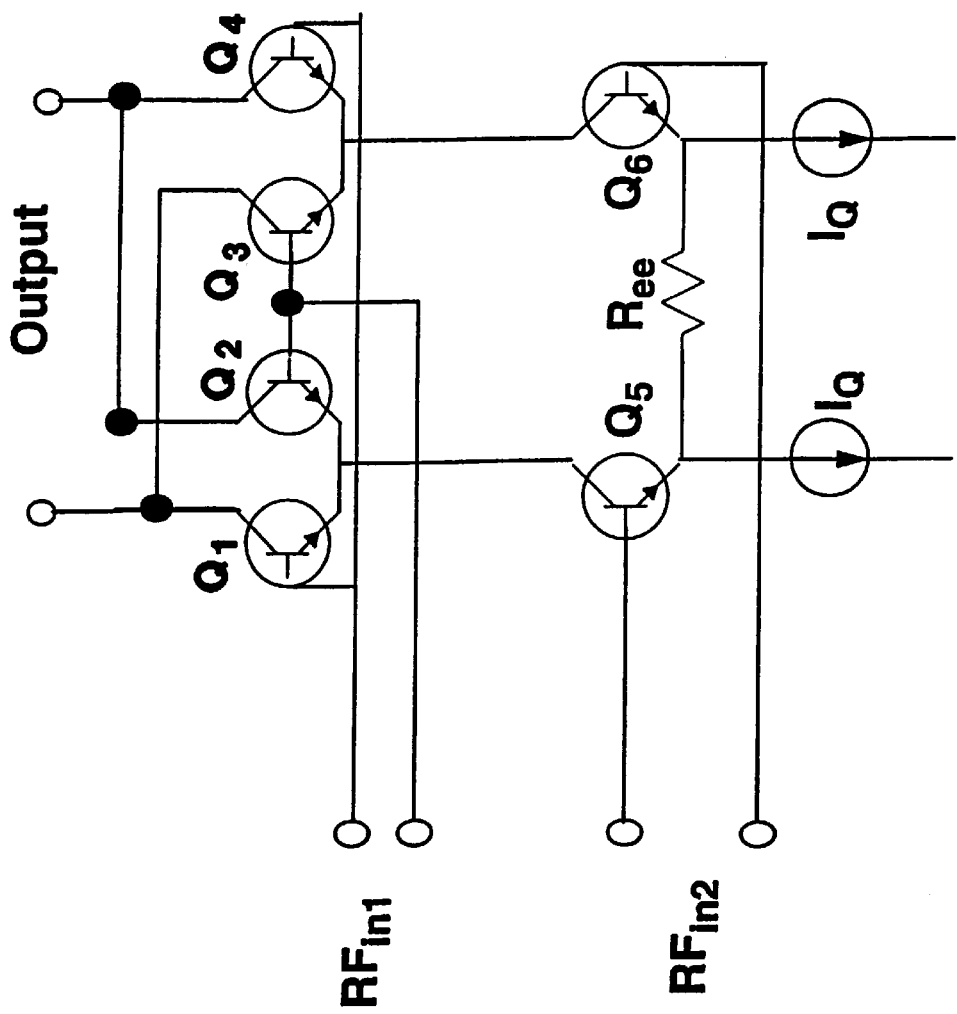
FIG. 1A is a schematic diagram of a conventional Gilbert cell mixer.
Figure 2:
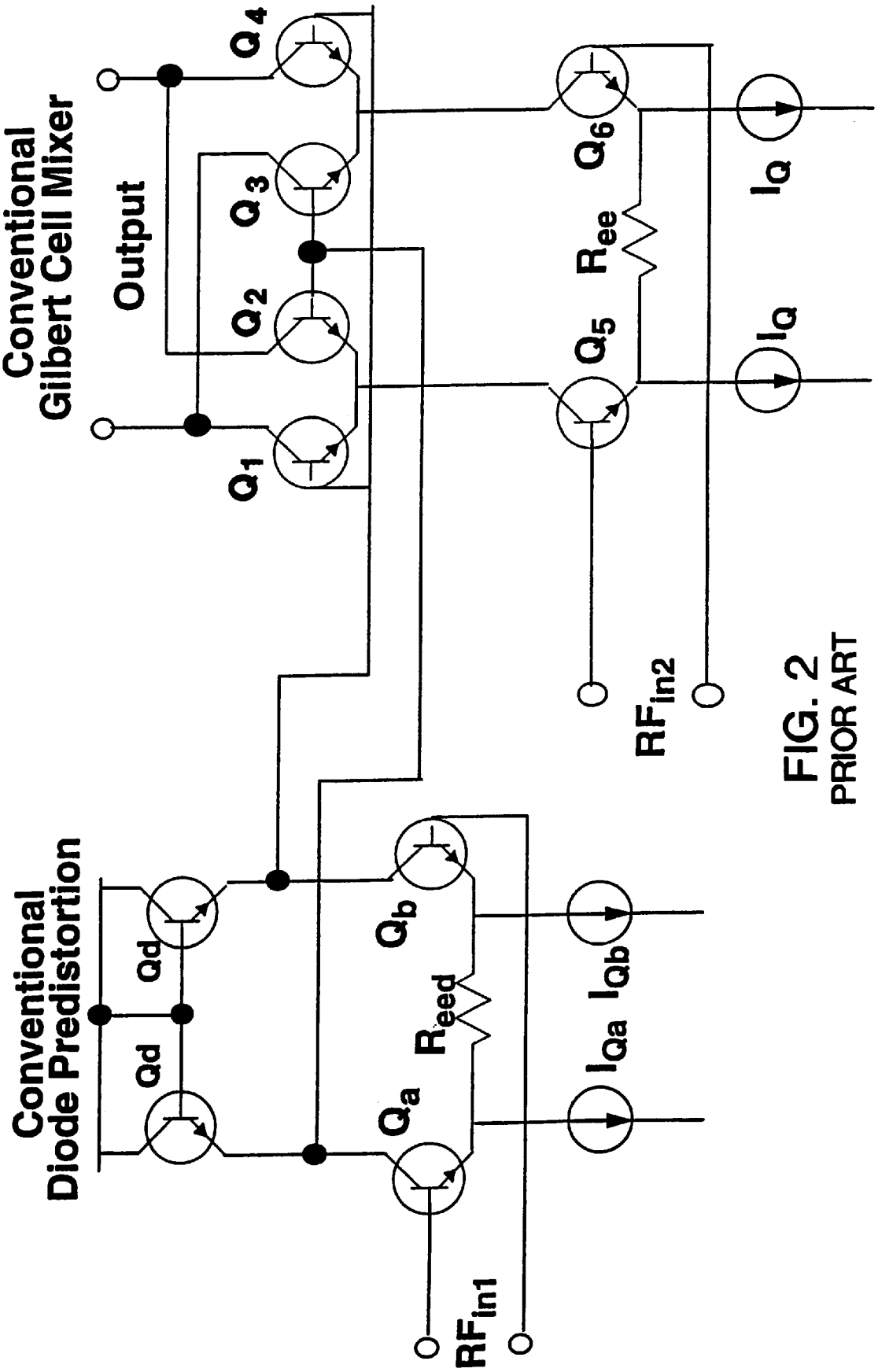
FIG. 2 is a schematic diagram of a conventional Gilbert cell mixer with a predistortion circuit.
Figure 3:
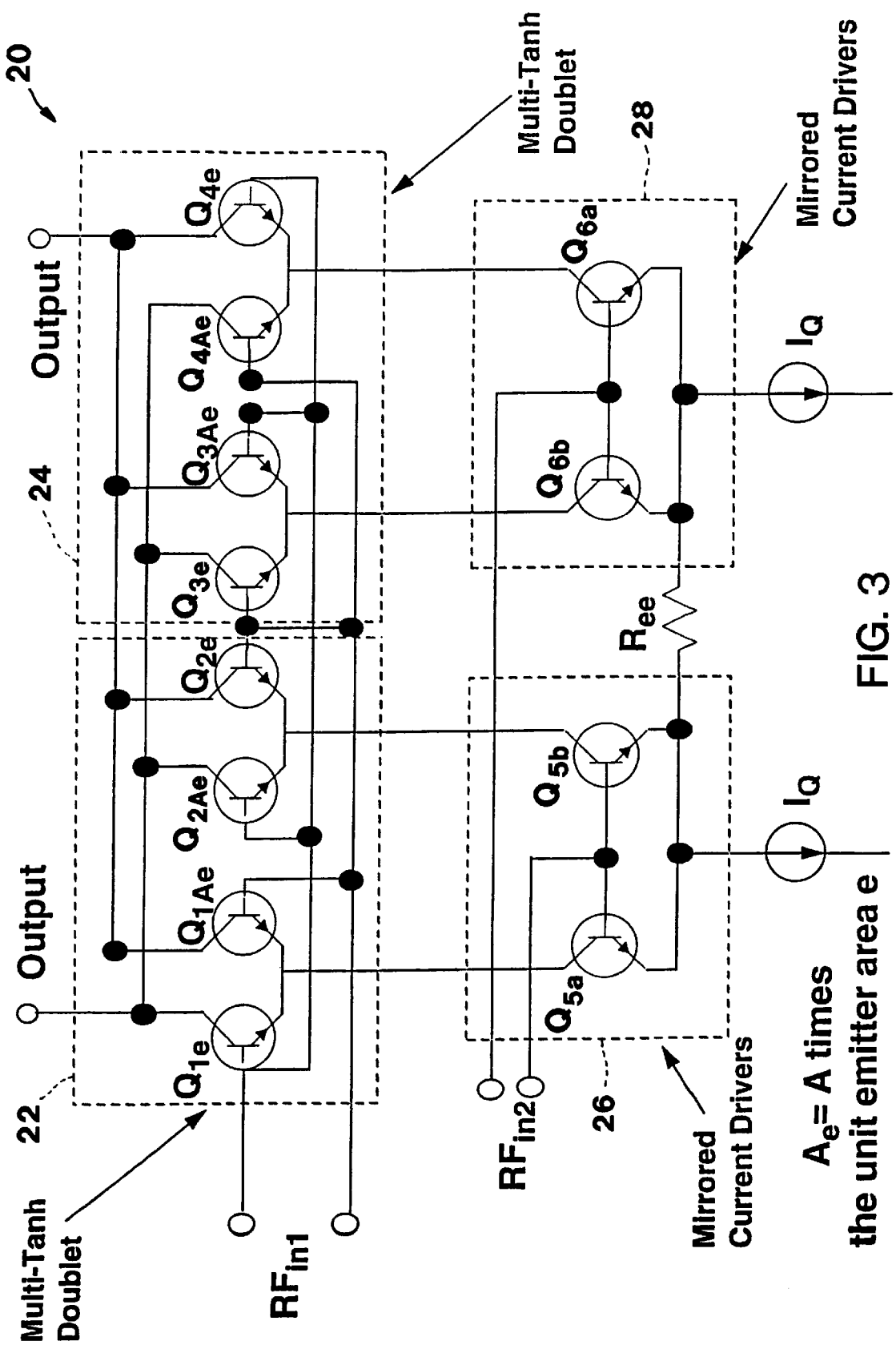
FIG. 3 is a schematic diagram of one embodiment of a wide dynamic range bilinear multiplier in accordance with the present invention.
Figure 5:
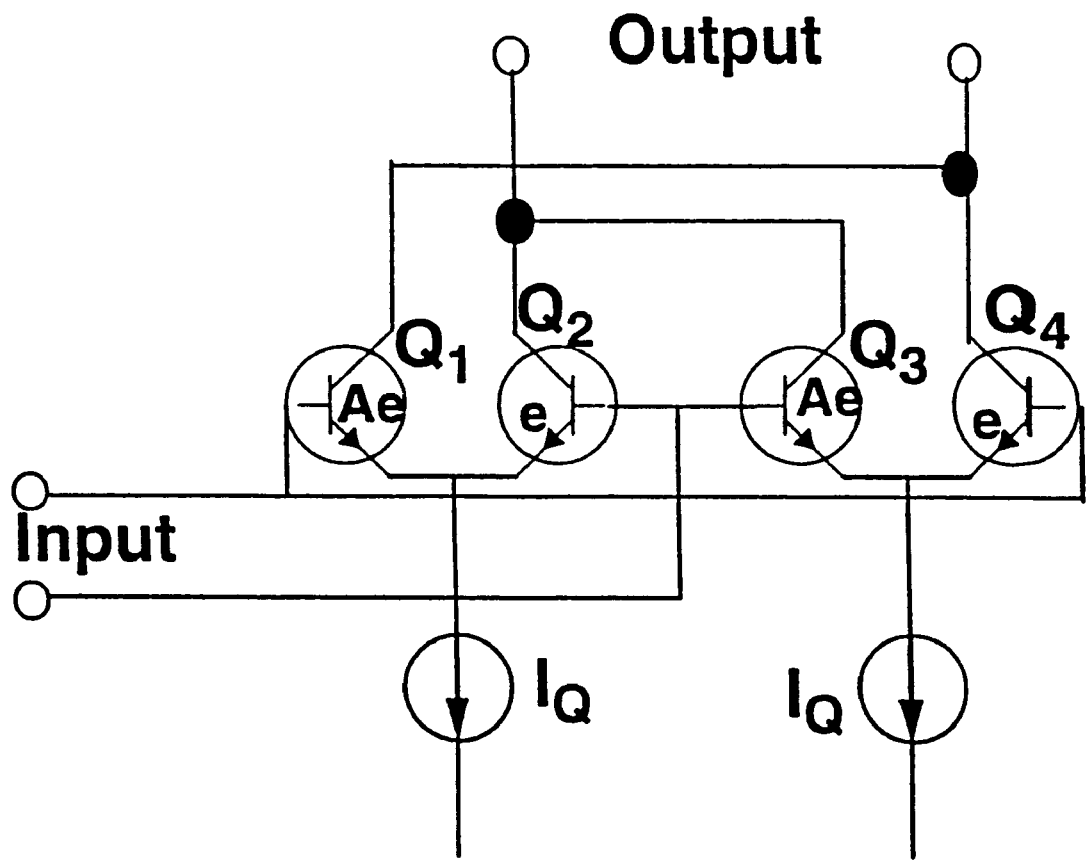
FIG. 5 is a schematic diagram of a conventional multi-tanh doublet applied to a differential amplifier.
Figure 6:
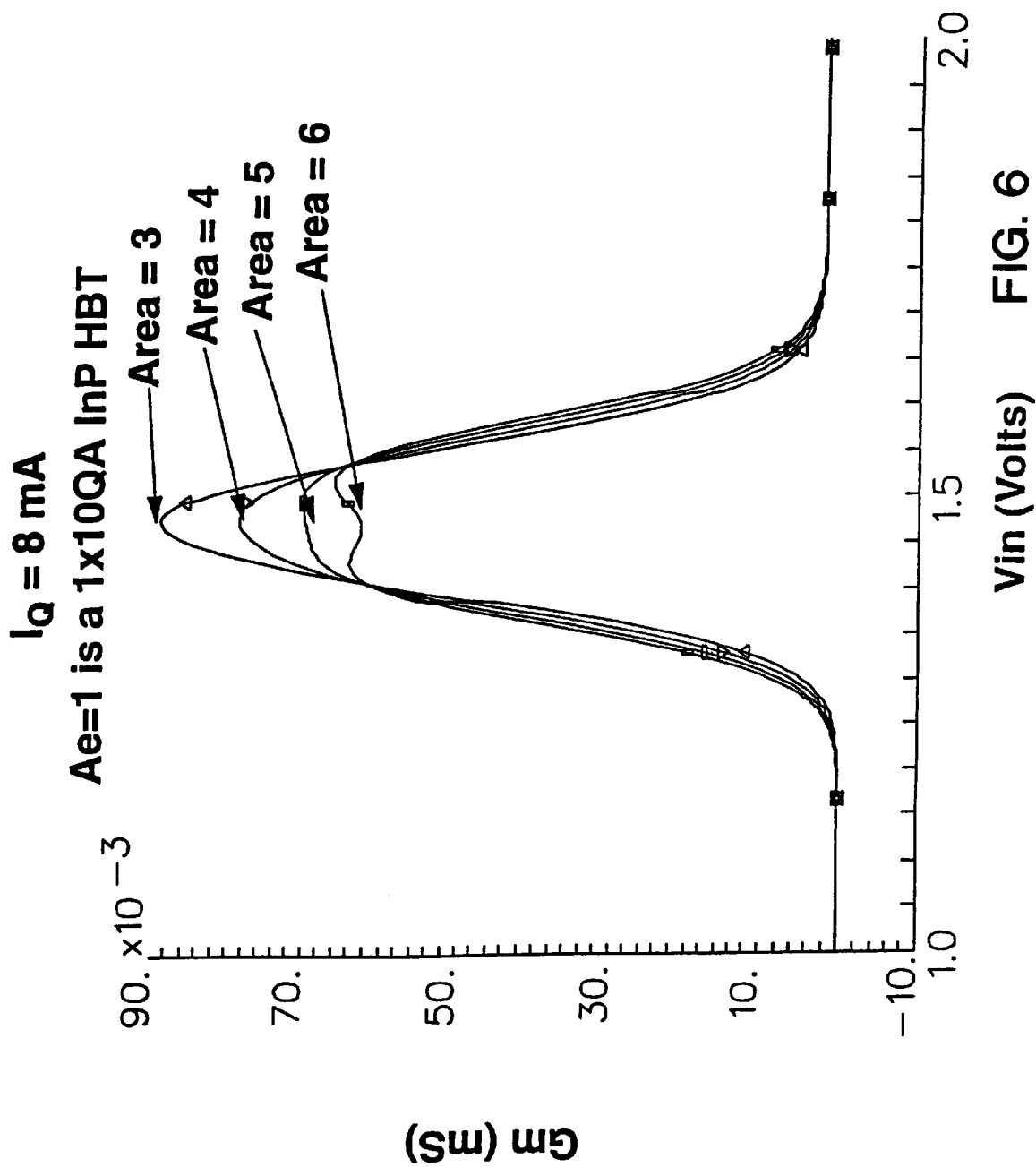
FIG. 6 is a graphical illustration of the transconductance $G_m$ as a function of input volt $V_{in}$ of the multi-tanh doublet illustrated in FIG. 5.

In a first embodiment of the invention, illustrated in FIG. 3, a plurality of multi-tanh doublets (as discussed below) are integrated into the Gilbert cell topology as illustrated in FIG. 1 to provide extended linearity of the top quad core of transistors Q1, Q2, Q3 and Q4, normally used as a local oscillator (LO) port of an active mixer. A conventional multi-tanh doublet applied to a differential amplifier circuit is illustrated in FIG. 5 as disclosed in "DESIGN CONSIDERATIONS FOR BJT ACTIVE MIXERS", supra. The multi-tanh doublet includes four transistors, Q1, Q2, Q3 and Q4. As shown, the transistors Q2 and Q4 are provided with an emitter area e. The transistors Q1 and Q3 are provided with an emitter area $A_e$, where $A_e=A$ times the emitter area of e. By optimizing the area $A_e$ of the transistors Q1 and Q3 with respect to the transistors Q2 and Q4, a maximally flat dc transconductance characteristic can be achieved as generally illustrated in FIG. 6. FIG. 6 illustrates the dc transconductance $G_m$ characteristic of the multi-tanh doublets illustrated in FIG. 5 for various emitter areas $A_e$. The dc transconductance $G_m$ can be treated as a measure of the output current response to a voltage excitation at the input. The region where the transconductance $G_m$ is flat over the input voltage amplitude determines the linear input range of the circuit. As shown, in FIG. 6, instantaneous dc transconductance $G_m$ is optimally flat over an extended input voltage range for an area of about 5. As the area is decreased toward 1, the input voltage range where the transconductance $G_m$ maintains its flatness declines and approaches the simple differential pair case (i.e. area=1). The advantage of the multi-tanh doublet over a conventional emitter degeneration resistor is the absence of the resistive thermal noise which degrades the dynamic range of the differential pair. The use of the emitter degeneration resistor also reduces the voltage headroom as well as results in dynamic phase distortion as commonly known in wideband amplifiers for high data rate fiber optic applications. As such, emitter degeneration, useful in differential amplifiers as illustrated in FIG. 5, is not heretofor been to be useful with a Gilbert cell mixer whose dynamic phase characteristics must be well behaved.

Returning to FIG. 3, the bilinear multiplier in accordance with the present invention, generally identified with the reference numeral 20, includes a pair of multi-tanh doublets 22 and 24, which replace the conventional transistor quad core transistors Q1, Q2, Q3 and Q4 of the conventional Gilbert mixer shown in FIG. 1. The doublet 22 includes the transistors $Q_{1e}$, $Q_{1Ae}$, $Q_{2Ae}$ and $Q_{2e}$ while the multi-tanh doublet 24 includes the transistors $Q_{3e}$, $Q_{3Ae}$, $Q_{4Ae}$ and $Q_{4e}$ configured as generally shown in FIG. 3. The linear input voltage range of the multi-tanh doublet 22 and 24 is maximized by proper selection of the emitter areas for the transistors Q1Ae, Q2Ae, Q3Ae and Q4Ae, with respect to the transistors Q1e, Q2e, Q3e and Q4e where A is an area factor greater than one. As discussed in "DESIGN CONSIDERATIONS FOR BJT ACTIVE MIXERS", supra, the optimum area factor $A_e$ has been found to be about 3.7. Because each of the multi-tanh doublets 22 and 24 require isolated current sources, each current source is electrically isolated from DC up to the highest RF frequency of interest. The isolated current sources are provided by replacing the bottom differential pair transistors Q5 and Q6 of a conventional Gilbert mixer with mirror current drivers 26 and 28. The mirror driver 26 includes a pair of transistors Q5a and Q5b while the mirror current driver 28 includes the transistors Q6b and Q6a. The base and emitter terminals of the transistor Q5a are connected to the base and emitter terminals of the transistor Q5b, respectively, while their respective isolated collective terminals are electrically connected to the emitters of the transistors $Q_{1e}$, $Q_{1Ae}$ and $Q_{2e}$, $Q_{2Ae}$ respectively, providing the isolating currents to the first multi-tanh doublet 22. Similarly, the base and emitter terminals of the transistors Q6a are connected to the base and emitter terminals of the transistor Q6b while respective isolated collector terminals are electrically connected to the emitters of the transistors $Q_{3e}$, $Q_{3Ae}$ and $Q_{4e}$, $Q_{4Ae}$, respectively, providing the isolated current sources to the multi-tanh doublet 24. The relative areas of the transistors Q5a to Q5b as well as Q6a to Q6b determine the ratio of their respective collector current biases, which acts like a current sink to the multi-tanh doublets 22 and 24. Conventional emitter degeneration may be implemented between the two mirror current drivers 26 and 28 by an emitter degeneration resistor $R_{ee}$ as discussed above in order to extend linear input power range of the input port $RF_{in2}$.

Integrating the multi-tanh doublets 22 and 24 into a Gilbert cell mixer improves the linearity of the top quad core of the transistors Q1, Q2, Q3 and Q4 which is not heretofor been amenable to simple linearization, such as emitter degeneration without degrading other performance characteristics, but can also improve the dynamic phase characteristic of the device as well as reduces dc power consumption by eliminating the need for predistortion circuit. In addition, the integrated multi-tanh doublet Gilbert cell topology illustrated in FIG. 3 can be used to enhance circuitry which used predistortion linearization by replacing the conventional Gilbert cell with the topology illustrated in FIG. 3.

Figure 4:
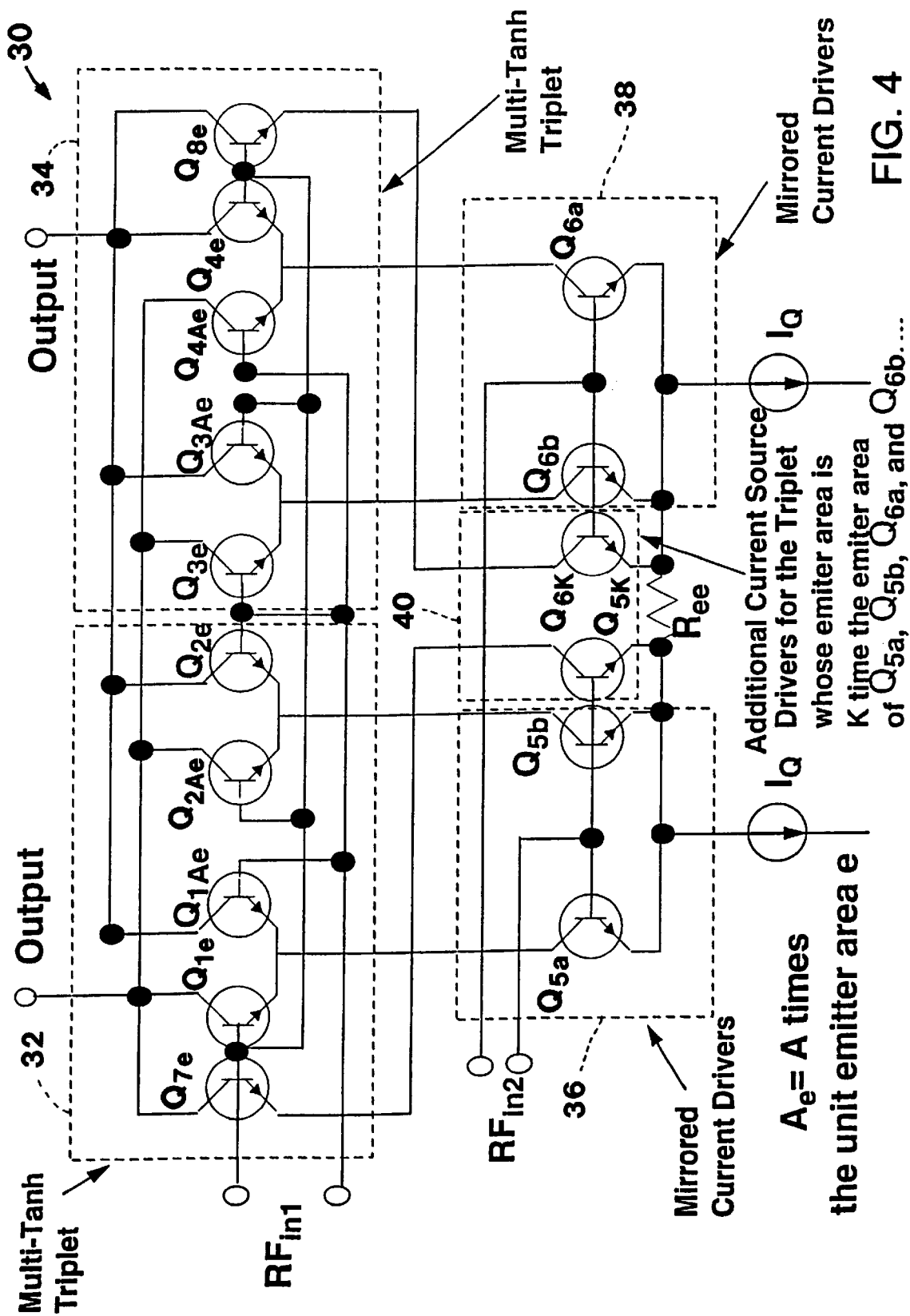
FIG. 4 is a schematic diagram of an alternate embodiment of the invention.

An alternate embodiment of the invention as illustrated in FIG. 4. In this embodiment, the bilinear multiplier, identified with the reference numeral 30, utilizes two multi-tanh triplets in place of the upper quad core of the transistors Q1, Q2, Q3 and Q4 of the conventional Gilbert mixer illustrated in FIG. 1. The multi-tanh triplet 32 includes the transistors $Q_{1e}$, $Q_{1Ae}$, $Q_{2Ae}$, $Q_e$ and $Q_{7e}$, while the multi-tanh triplet 34 includes the transistors $Q_{3e}$, $Q_{Ae}$, $Q_{4Ae}$, $Q_{4e}$ and $Q_{8e}$. The addition of the transistor $Q_{7e}$ is added to the multi-tanh doublet 22 (FIG. 3) to form the multi-tanh triplet 32. Similarly, the transistor $Q_{8e}$ is added to the multi-tanh doublet 24 (FIG. 3) to form the multi-tanh triplet 34. The linear multiplier circuit 30 also includes a pair of mirrored current drivers 36 and 38. The mirrored current driver 36 includes the transistors Q5a and Q5b while the mirror current driver 38 includes the transistors Q6a and Q6b, similar to the mirror current drivers 26 and 28 illustrated in FIG. 3. An additional transistor pair 40, which includes the transistors Q5k and Q6k, are added to the differential voltage to current drivers to provide an additional scaling area K, to be used to optimize the proportion of the current $I_Q$, which biases the transistors $Q_{7e}$ and $Q_{8e}$. As such, area scaling of the transistors adds an additional linearity factor for the multi-tanh triplets 32 and 34.

Although the present invention is illustrated integrating multi-tanh doublets 22, 24 as well as multi-tanh triplets 32 and 34 into a conventional Gilbert mixer topology, the principles of the invention are not so limited. As should be clear to anyone skilled in the art, the principles of the present invention can be extended to by multipliers formed from two multi-tanh N-tuplets.

Figure 7:
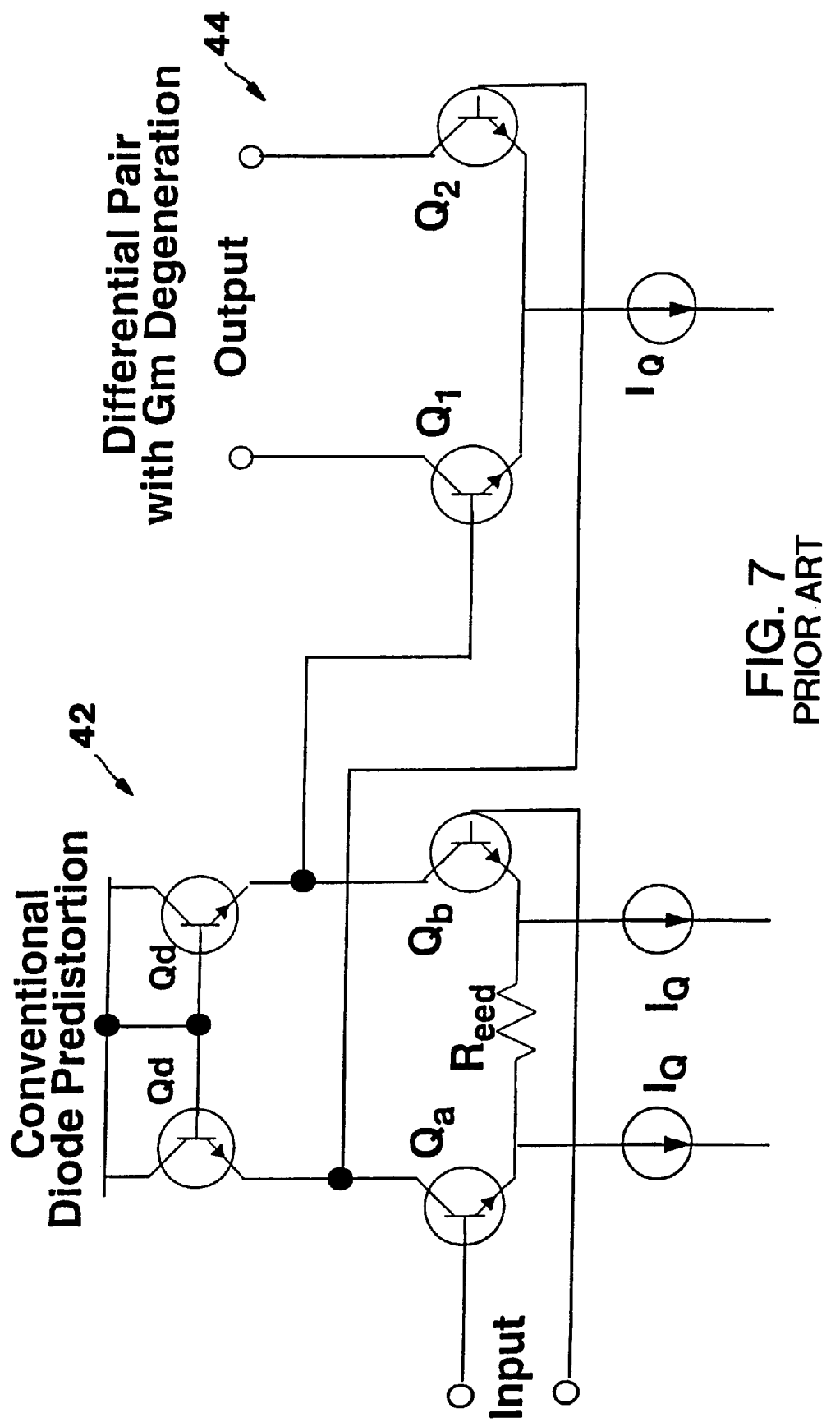
FIG. 7 is a schematic diagram of a conventional predistortion circuit applied to a conventional differential transistor pair.
Figure 8:
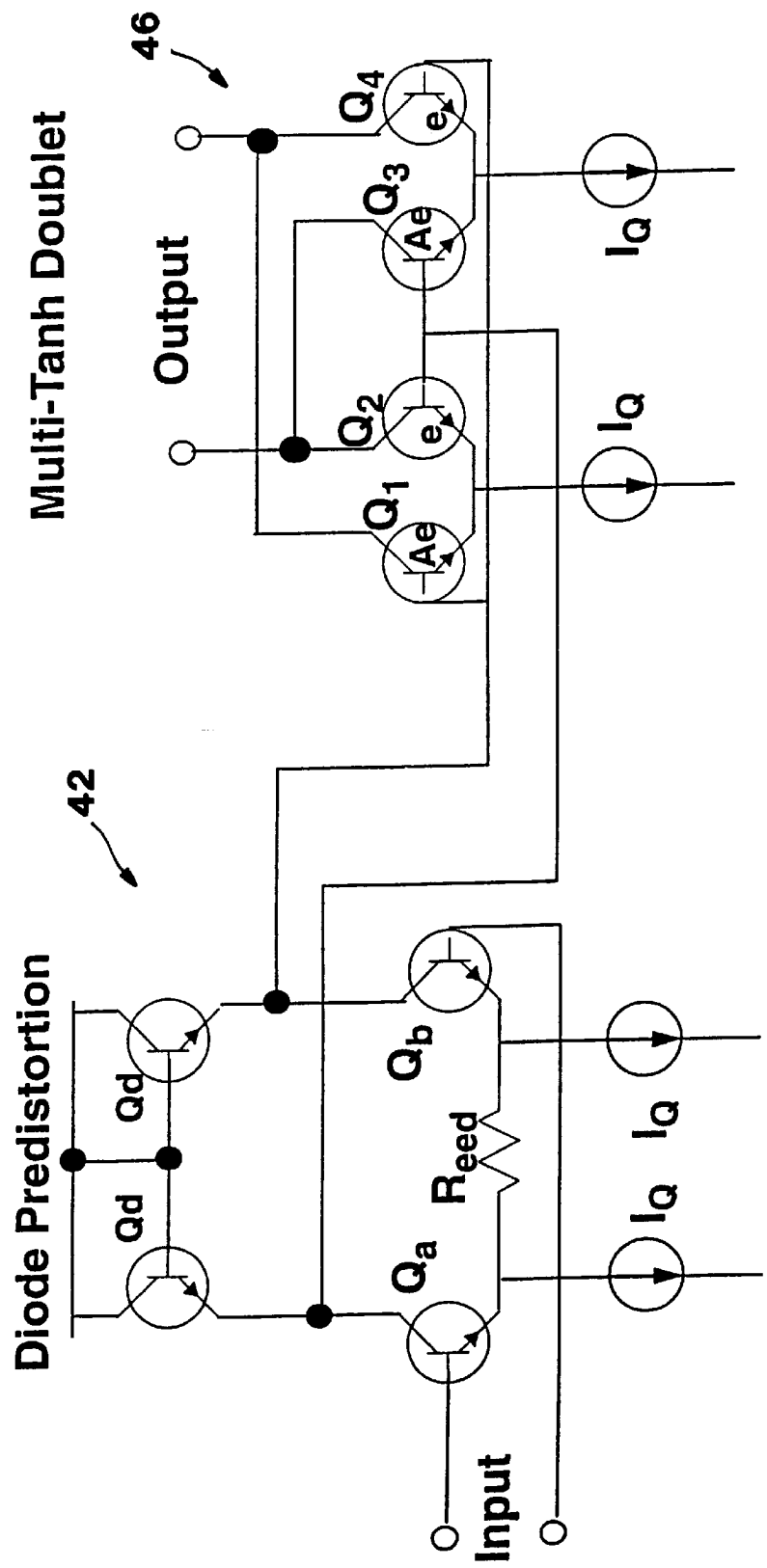
FIG. 8 is a schematic diagram of a conventional diode predistortion circuit illustrated in FIG. 7 applied to a multi-tanh doublet illustrated in FIG. 5.

As discussed above, a diode predistortion circuit can be utilized to provide linearity of the upper core quad of transistors Q1, Q2, Q3 and Q4. FIG. 7 illustrates a conventional diode predistortion circuit 42 applied to a pair of differentially connected transistors Q1 and Q2. A predistortion circuit linearizes the differential pair characteristics by predistorting the input signal with an inverse tanh function which results in a relatively expanded linear input voltage/power range. As discussed above, there are several disadvantages in using such a diode predistortion circuit 42, such as, an additional dc power consumption as well as thermal noise due to the emitter degeneration of the voltage to current converter of the predistortion 42. In order to achieve even greater linearity, an alternate embodiment of the invention is illustrated in FIG. 8 in which the diode predistortion circuit is applied to a multi-tanh doublet 46, for example, as illustrated in FIG. 5 resulting in compound enhancement in the linear input range.

Figure 9:
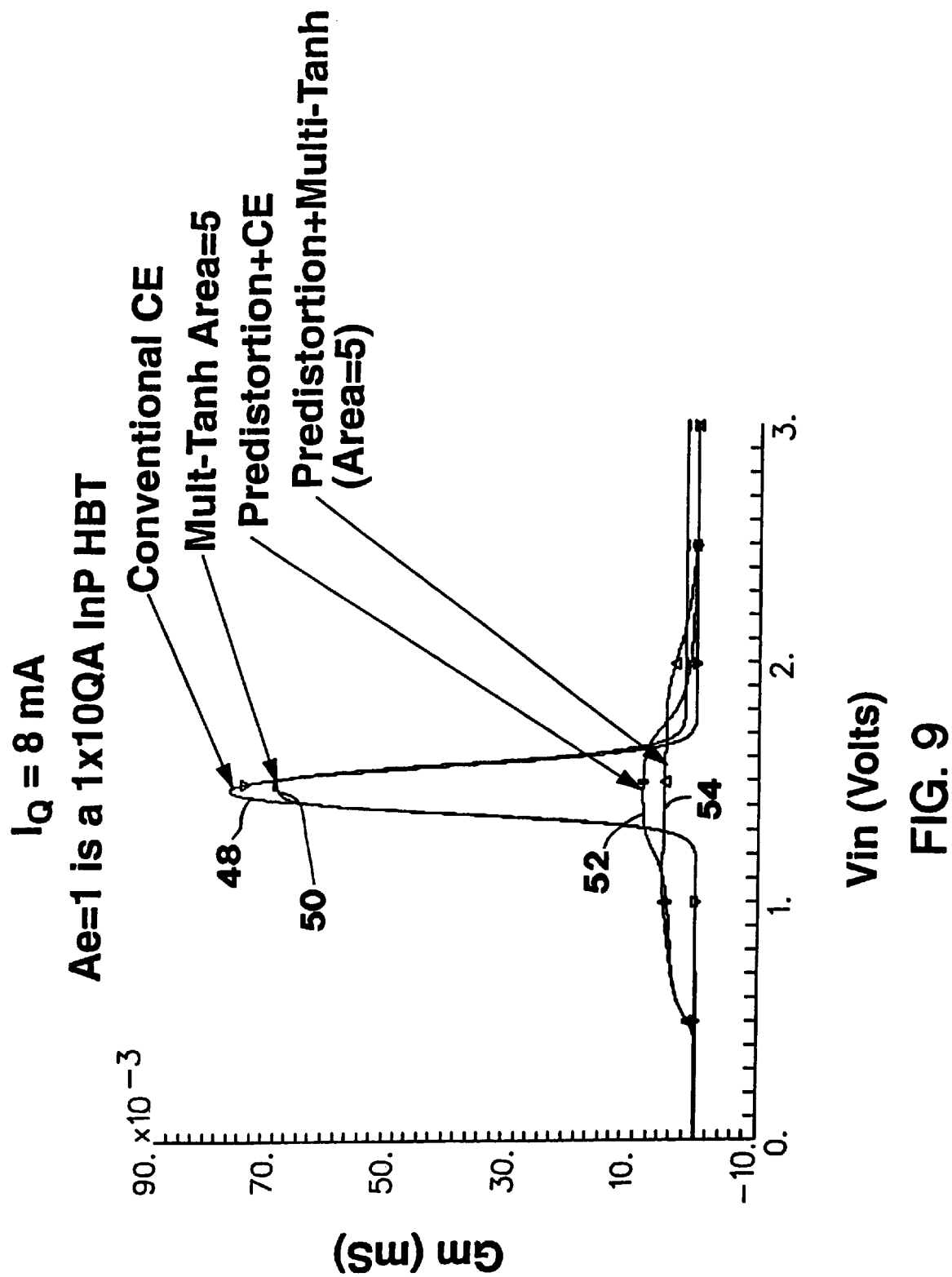
FIG. 9 comparatively illustrates the transconductance $G_m$ as a function of input volts for conventional common emitter differential pair, a common emitter differential pair with predistortion and a multi-tanh doublet.

FIG. 9 is a graphical illustration illustrating the transconductance $G_m$ as a function of input voltage $V_{in}$ for four different circuit configurations: a conventional common emitter amplifier; a multi-tanh device with an area equal to 5; a common emitter amplifier with a diode predistortion circuit 42; and a multi-tanh doublet in combination with a diode predistorting represented by the curves 48, 50, 52 and 54. FIG. 9 illustrates the multi-tanh doublet achieves a relatively wider mirror input range relative to a conventional common emitter differential pair as shown by the flatter transconductance $G_m$ but at a slight sacrifice to the transconductance $G_m$ level. The curve 52 illustrates that utilizing a predistortion circuit 42 in combination with a common emitter differential pair results in a significant improvement in linearity but with a significantly reduced peak transconductance $G_m$. The curve 54 illustrates that the diode predistortion circuit 42 applied to the multi-tanh doublet 46, as illustrated in FIG. 8, provides even greater linear input range, but at a reduced level peak transconductance $G_m$.

Many frequency modulation applications require a mixer to behave linearly on both input ports and thus require what is known as a bilinear mixer. One such application is a variable amplitude phase modulation (VAP) of an incoming RF signal as illustrated in FIG. 10. A VAP function may also be required in some transmitter applications to adjust for amplitude and phase errors created in the post power amplification of a transmission link. As such, relatively accurate control of both the amplitude and phase is required in addition to other performance characteristics, such as wideband width and high frequency. In such VAP applications, both input ports of the multiplier must operate linearly with respect to their input signals. In other words, the input ports must not introduce additional amplitude and distortion on top of the desired premodulated amplitude and phase information impressed on the signal. An exemplary application of a bilinear amplifier is illustrated in FIG. 10 in which an exemplary 10–11 GHz RF signal is amplitude and phase modulated by an analog signal at the LO port of the multiplier 56; operating at approximately a 3 GBPS rate resulting in a power density function centered at the 10, 11 GHz RF input frequency at the IF output. The amplitude of the 10, 11 GHz RF input signal can be controlled is amplitude and phase where the IF output amplitude is linearly related to the LO analog signal from a digital to analog converter (DAC) 58 which receives a digital word input 60.

The IF output of the VAP can also be modulated in phase by 180° because the DAC output is controlling the LO modulating port, the low port of the multiplier which must operate linearly over a substantial input voltage range, for example + or −300 mV. By using a Gilbert cell multiplier for the VAP, a preferred assignment of the RF and LO ports is required in order to achieve high frequency operation. In particular, the bottom port of the Gilbert cell may be utilized as a high frequency port in order to achieve optimal broadband frequency operation, due in part to the collector terminals of the bottom differential pair of the Gilbert mixer being exposed to a lower impedance emitter which reduces the Miller effect that often limits the bandwidth performance in typical differential amplifiers. In addition, emitter degeneration can be employed to obtain more bandwidth in linearity at the expense of increased noise. However, the lower frequency analog modulating port must be assigned to the upper transistor quad of the Gilbert mixer; typically not linear with input voltage and normally requires predistortion linearization for VAP applications. While degeneration circuitry can be used for the upper transistor quad of the Gilbert mixer, this configuration results in degradation and bandwidth performance of the lower differential pair due to the higher impedance presented to its collector terminals and also has a dynamic detrimental effect on the dynamic phase response of the upper quad transistor core. Thus, conventional predistortion circuitry may be used but is constrained to the linear input range, whereas a Gilbert cell topology with multi-tanh doublets in combination with a predistortion circuit can result in an improved conversion gain, RF input linearity and well behaved dynamic phase transition without it adversely effecting the broadband conversion gain performance of the lower differential pair RF input port.

Figure 11A:
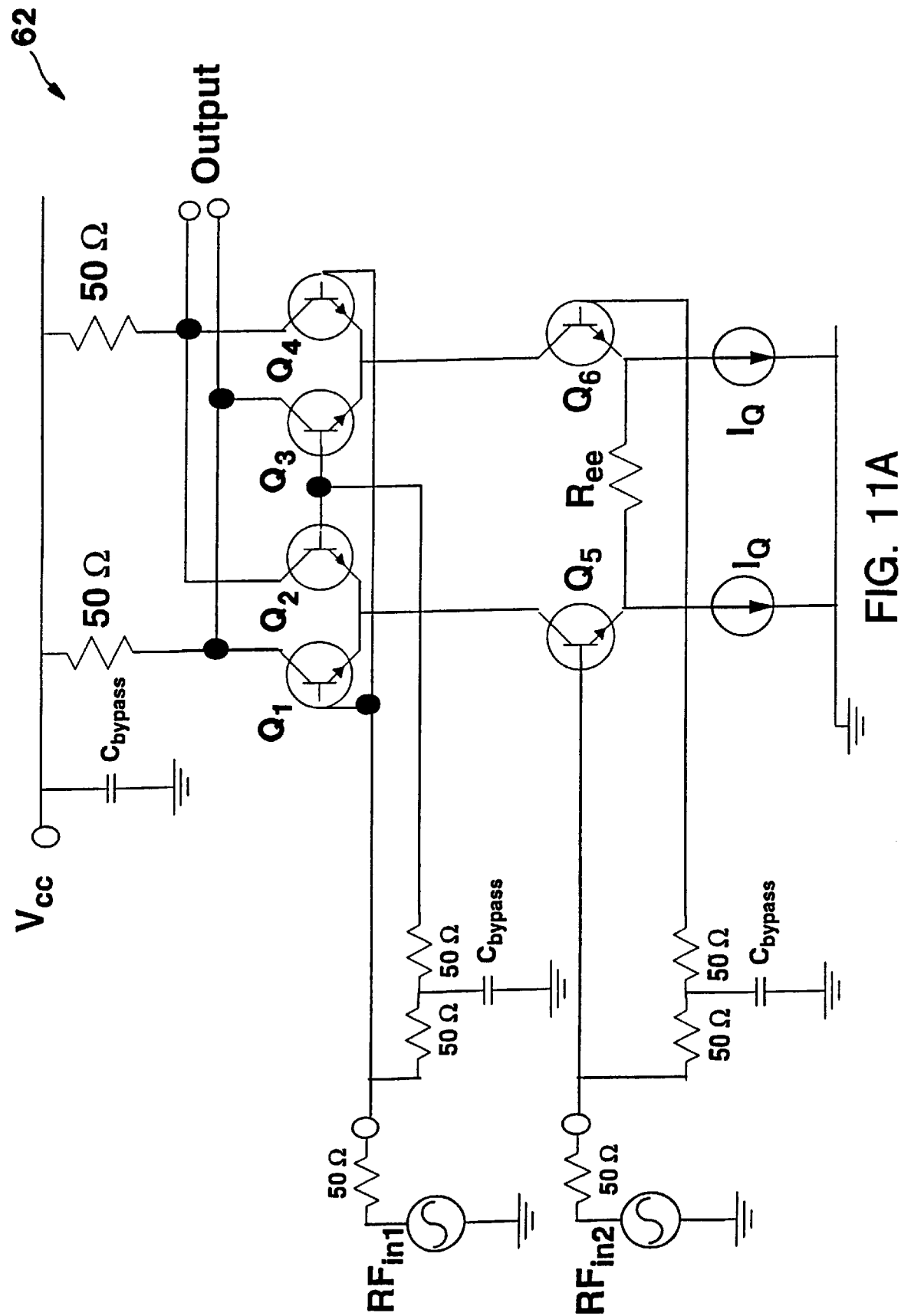
FIG. 11A is a schematic diagram of a conventional Gilbert cell mixer implemented as VAP.
Figure 11B:
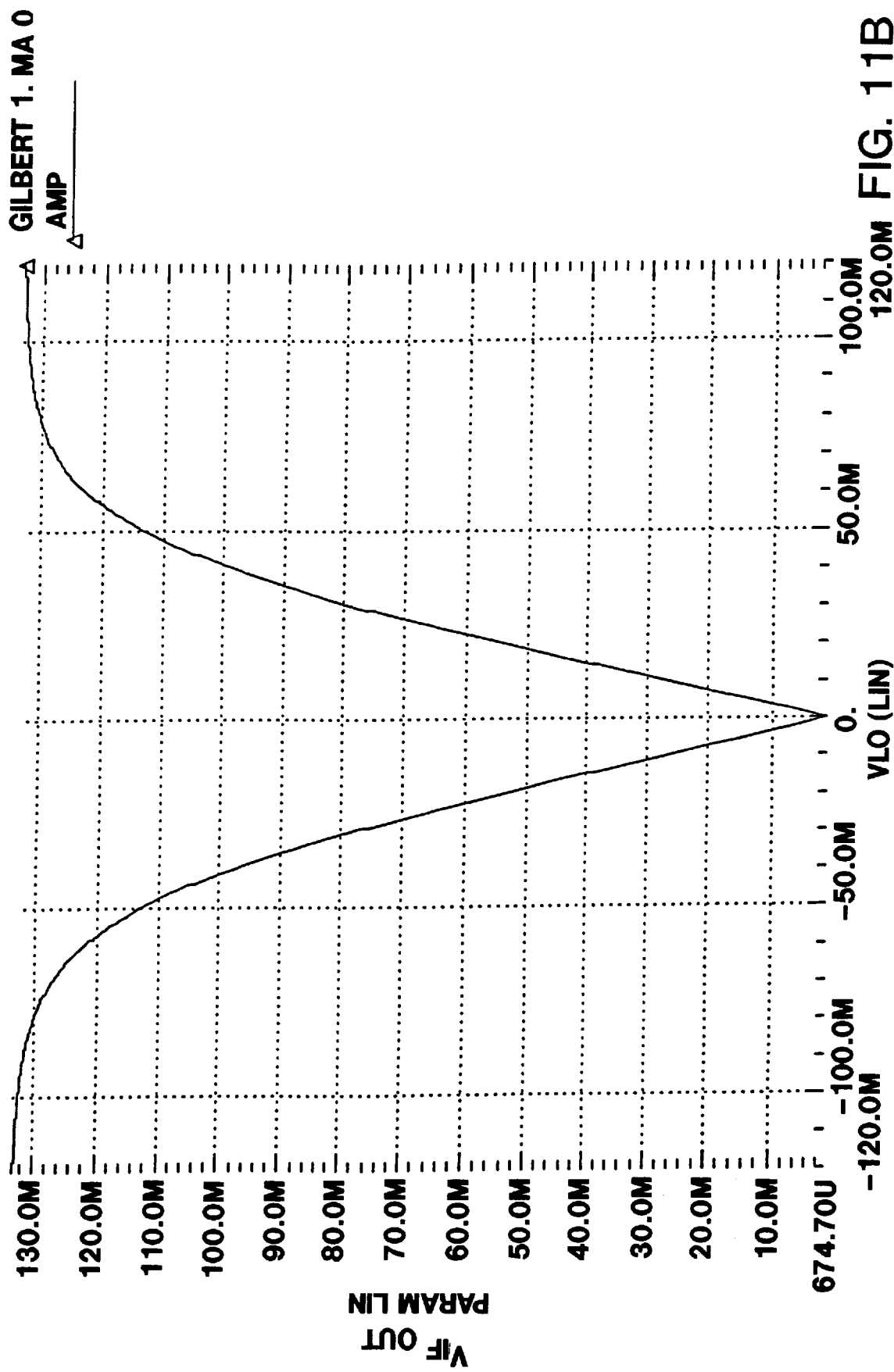
FIG. 11B is a graphical illustration illustrating the linear output voltage as a function modulated input voltage for the VAP illustrated in FIG. 11A.
Figure 11C:
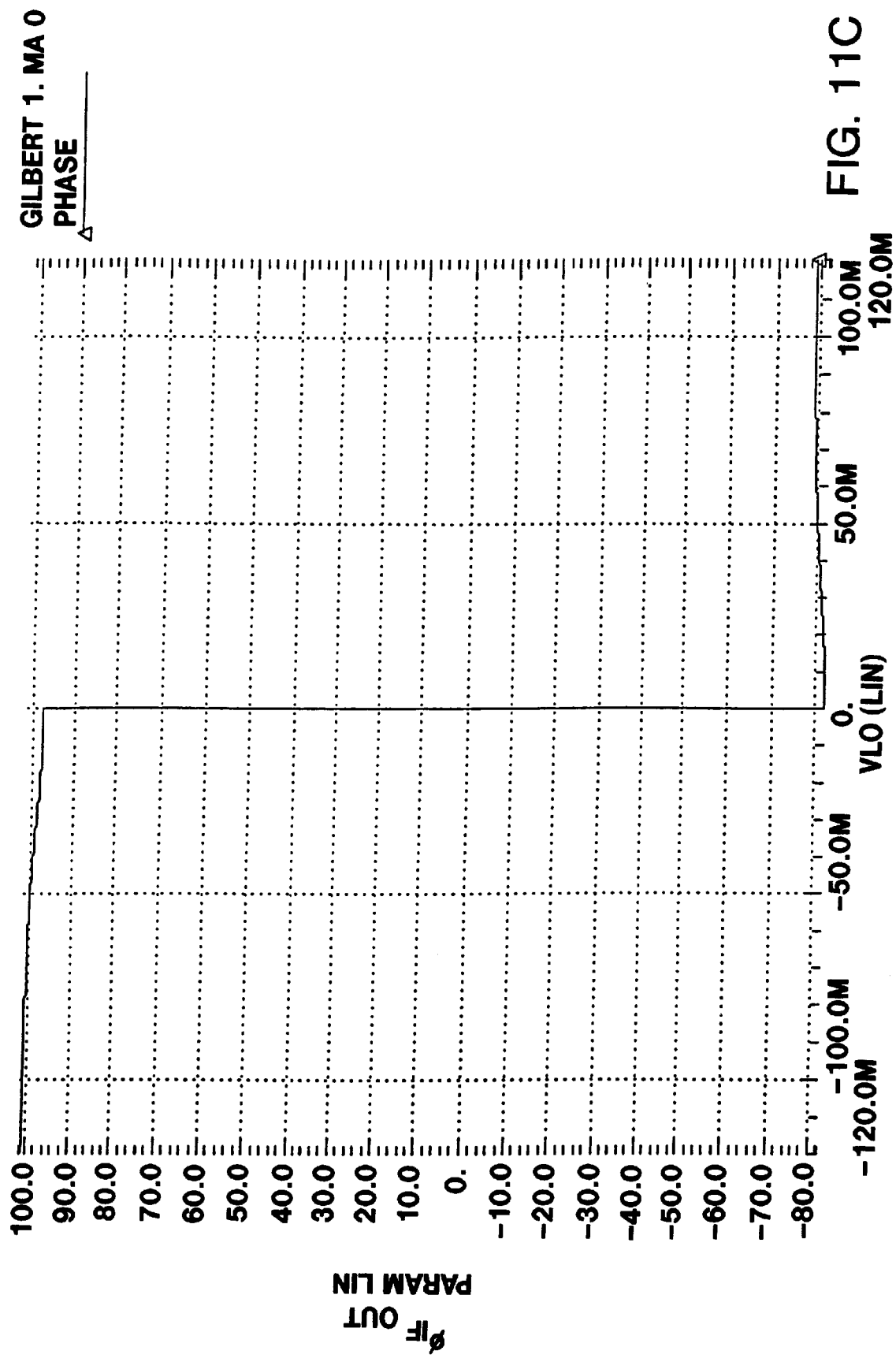
FIG. 11C is a graphical illustration of the dynamic phase transition characteristic of the VAP illustrated in FIG. 11A.
Figure 11D:
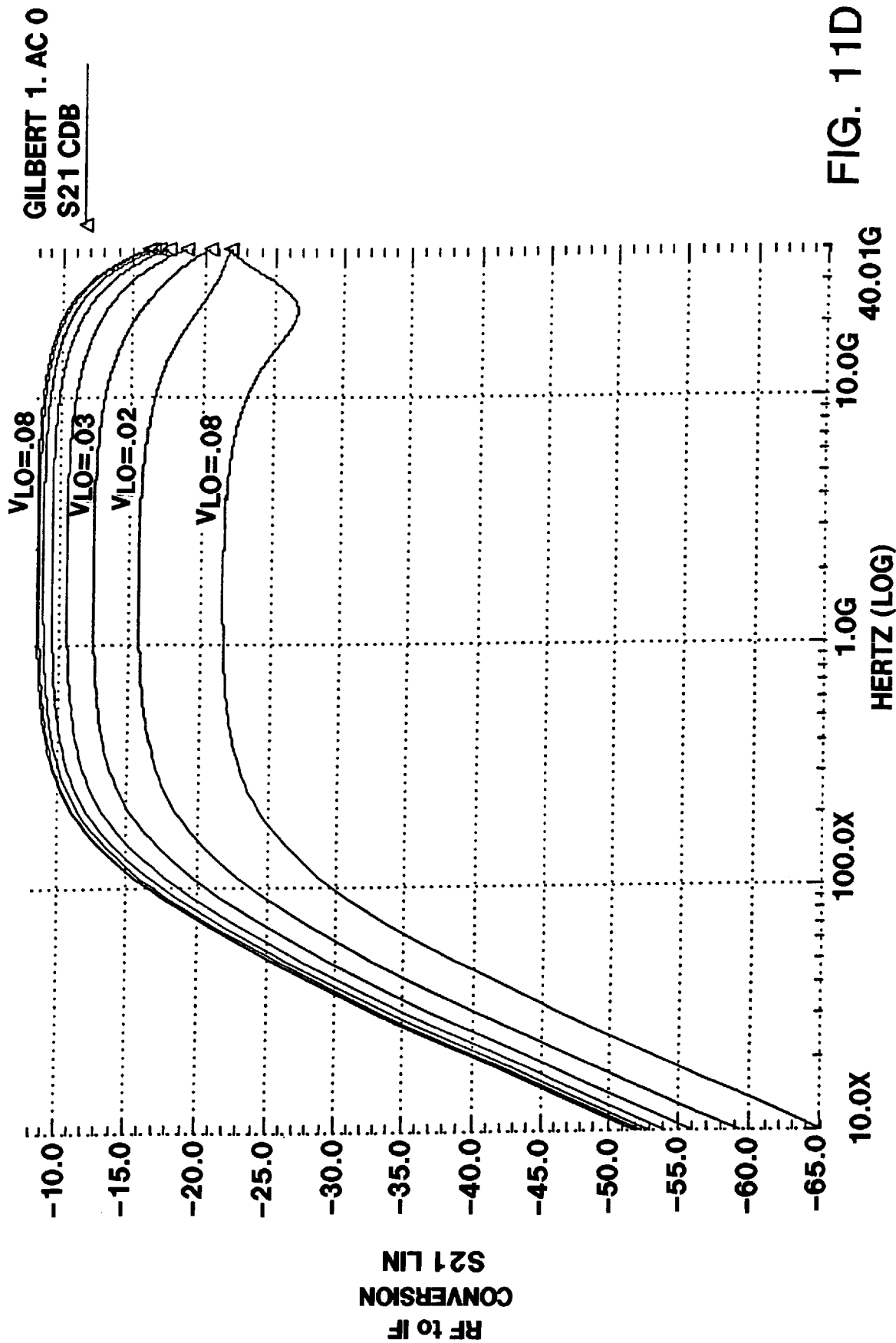
FIG. 11D is a graphical illustration illustrating the broadband conversion gain for various LO dc input voltage amplitudes for the VAP illustrated in FIG. 11A.

FIG. 11A illustrates a known application having a Gilbert cell in a VAP application. The linear output voltage for the circuit illustrated in FIG. 11A as a function of modulated input voltage characteristics is shown in FIG. 11B. The dynamic phase transition characteristics as well as the broadband conversion gain various LO dc voltages amplitudes for the circuit illustrated in FIG. 11A are illustrated in FIG. 11C and 11D, respectively.

Figure 12A:
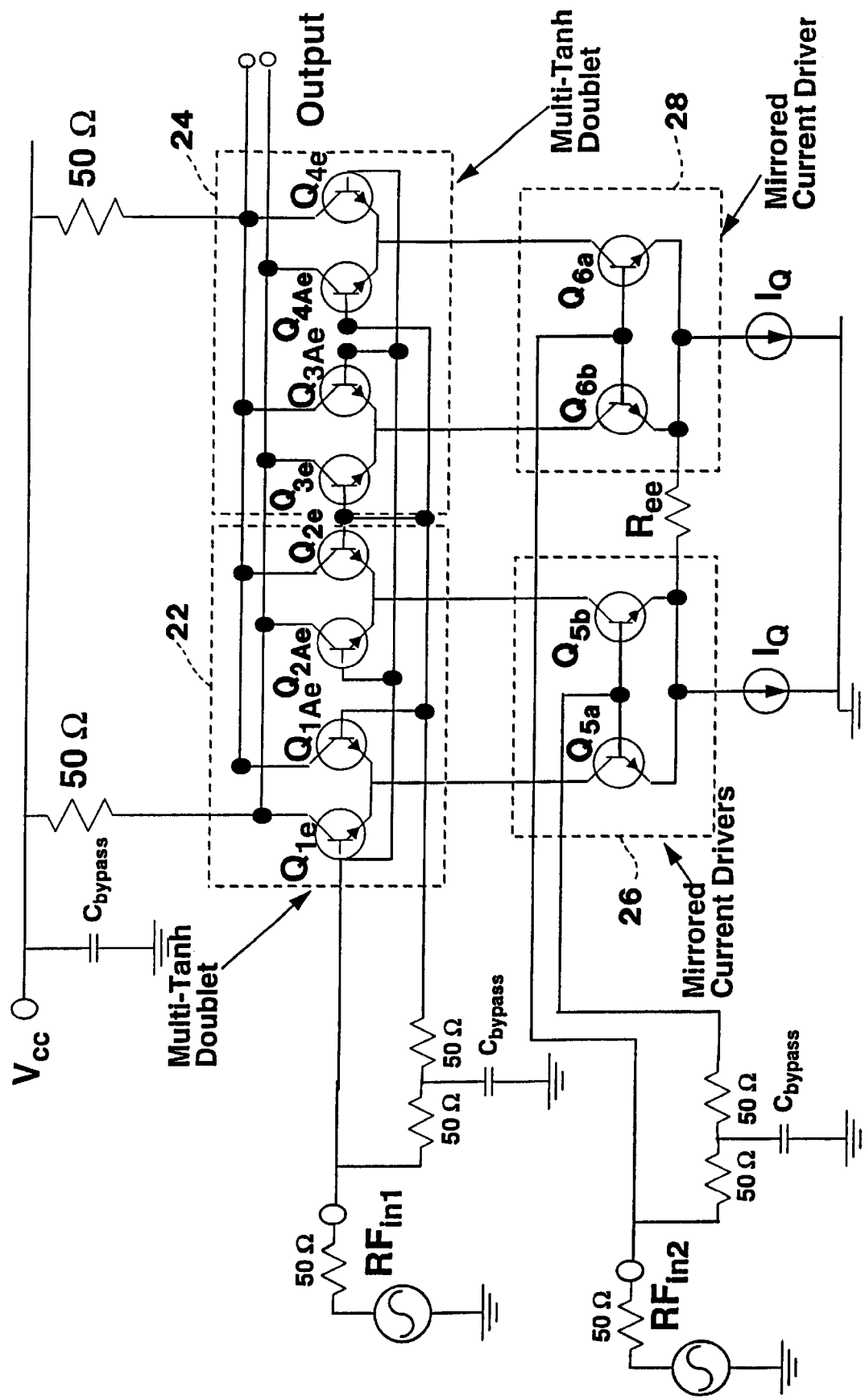
FIG. 12A is a schematic diagram of a VAP in accordance with the present invention.
Figure 12B:
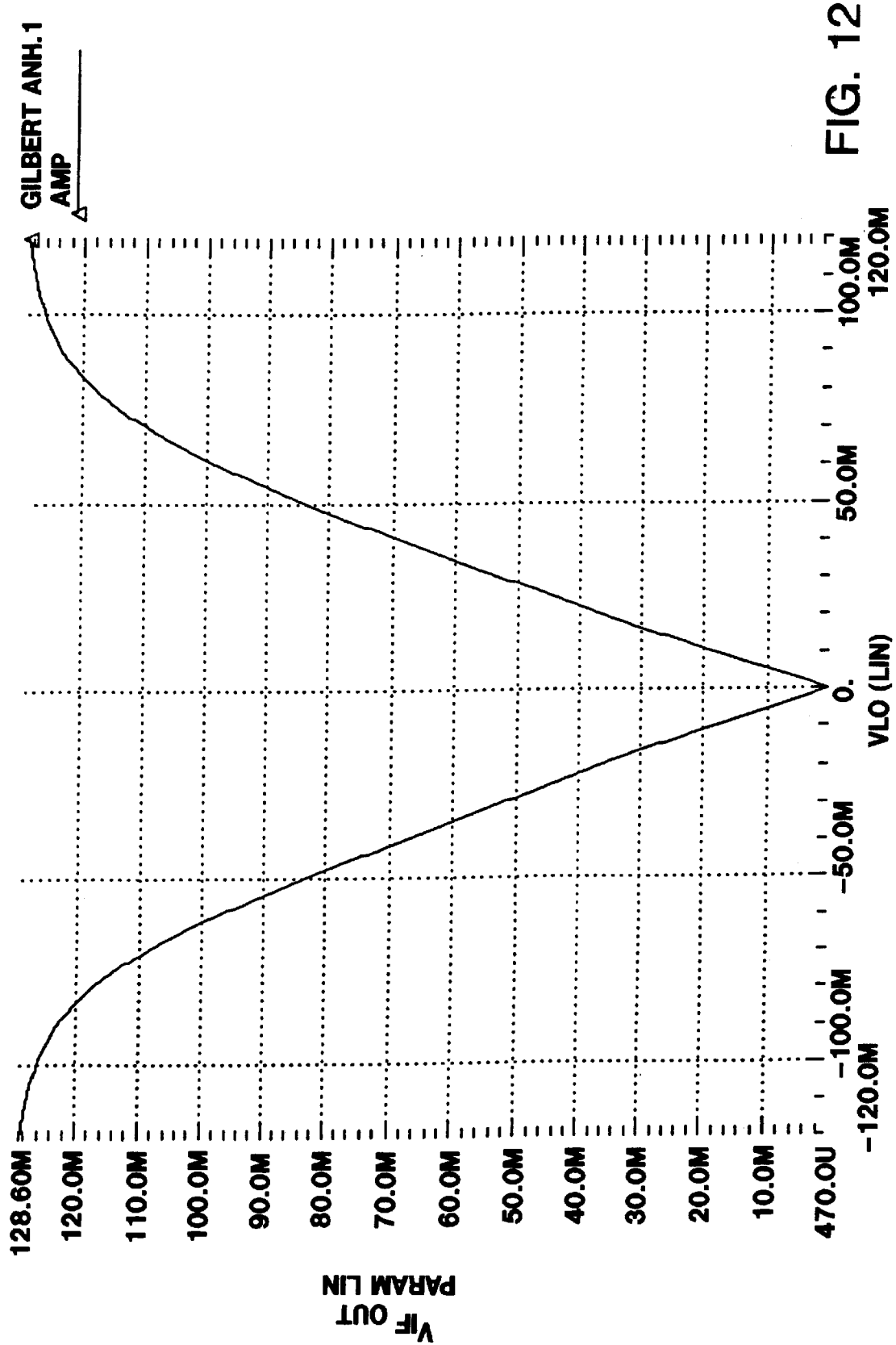
FIG. 12B is a graphical illustration of the linear output voltage as a function of modulated input voltage for the circuit illustrated in FIG. 12A.
Figure 12C:
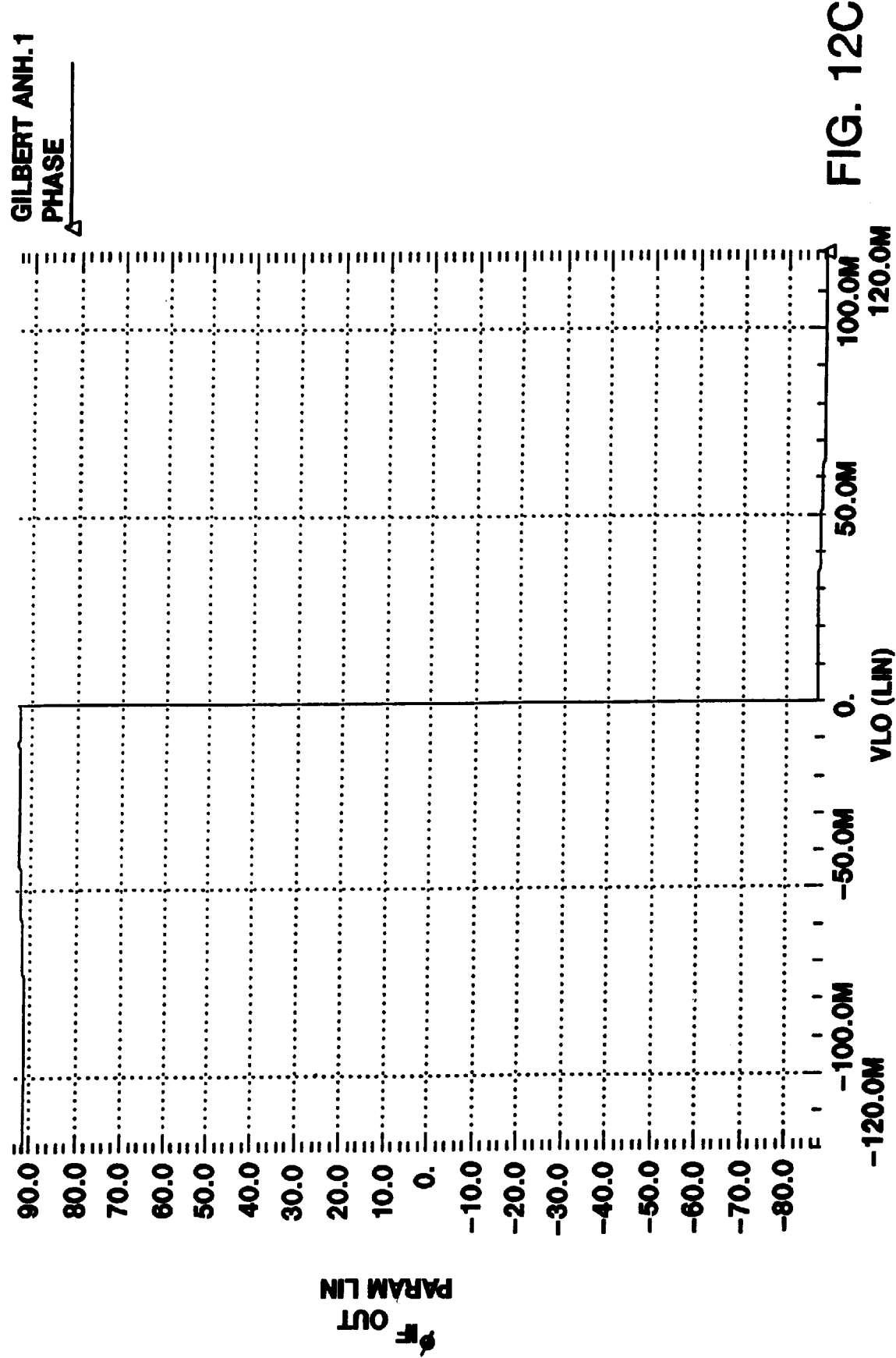
FIG. 12C is a graphical illustration of the dynamic phase transition characteristics of the circuit illustrated in 12A.
Figure 12D:
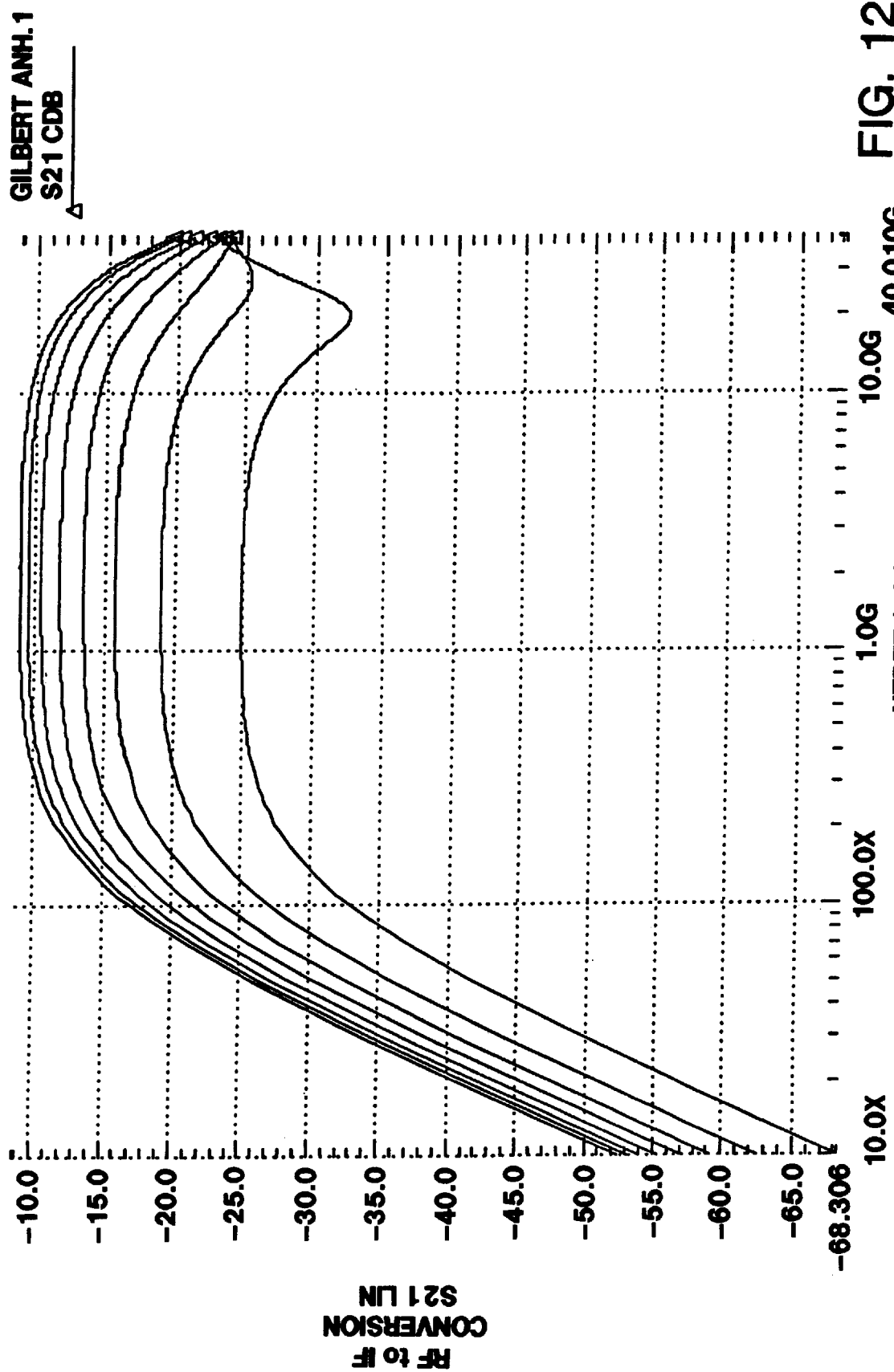
FIG. 12D is a graphical illustration of the broadband conversion gain for various LO dc input voltage amplitudes for the circuit illustrated in 12A.

FIG. 12A illustrates a Gilbert cell topology, in accordance with the present invention, for a voltage amplitude and phase (VAP). As shown, the circuit includes a pair of multi-tanh doublets 22 and 24 in combination with the mirror current drivers 26 and 28. FIGS. 12B, 12C and 12E illustrate the linear output voltages of function of modulated input voltage characteristics, dynamic phase transition characteristics and broadband conversion gain characteristics for various LO dc input voltage amplitudes for the circuit illustrated in FIG. 12A. By comparing FIGS. 11B to 12B, it is clear that the input amplitude linearity of the multi-tanh linearized Gilbert cells transistor quad provides substantial improvement in the linear input voltage range. FIGS. 11C and 12C illustrate the dynamic phase response for the two cases and indicate no degradation of the phase response for the multi-tanh linearized multiplier in accordance with the present invention with conventional emitter degeneration. In these FIGS. the phase should shift ideally 180° at zero LO input voltage and should have no residual phase error on either side of the transition. FIGS. 11D and 12D illustrate the conversion gain from the IF output to the RF input for various $V_{LO}$ modulation voltage levels. These curves show the broadband response is not significantly degraded by utilizing additional transistors of the multi-tanh doublets. The total emitter area size of the doublets can be reduced to obtain better bandwidth response without changing the relative area $A_e$ that has been optimized for linearity.

Figure 13A:
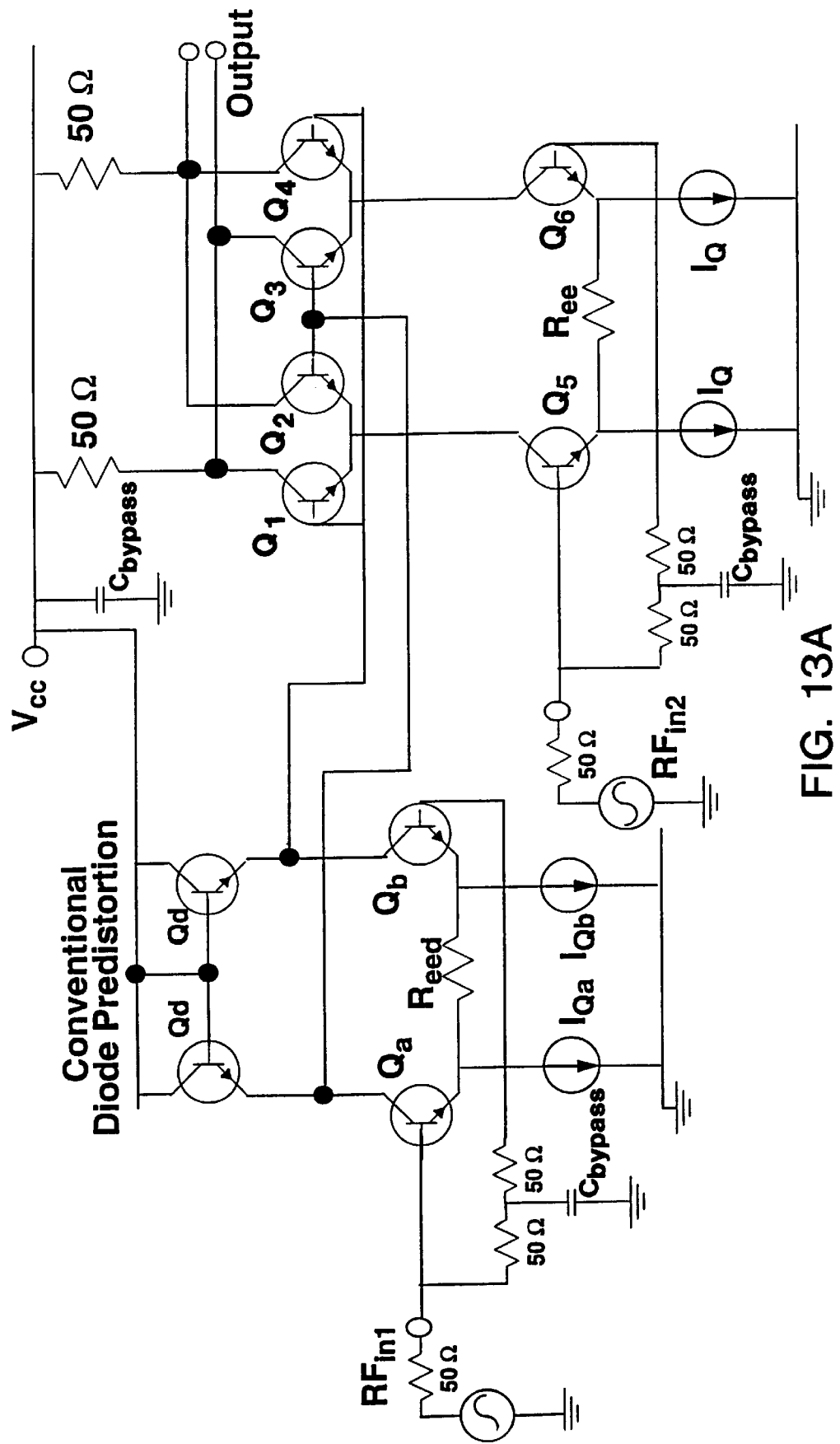
FIG. 13A is a schematic diagram of a conventional VAP formed from a Gilbert cell which includes a conventional diode distortion circuit.
Figure 13B:
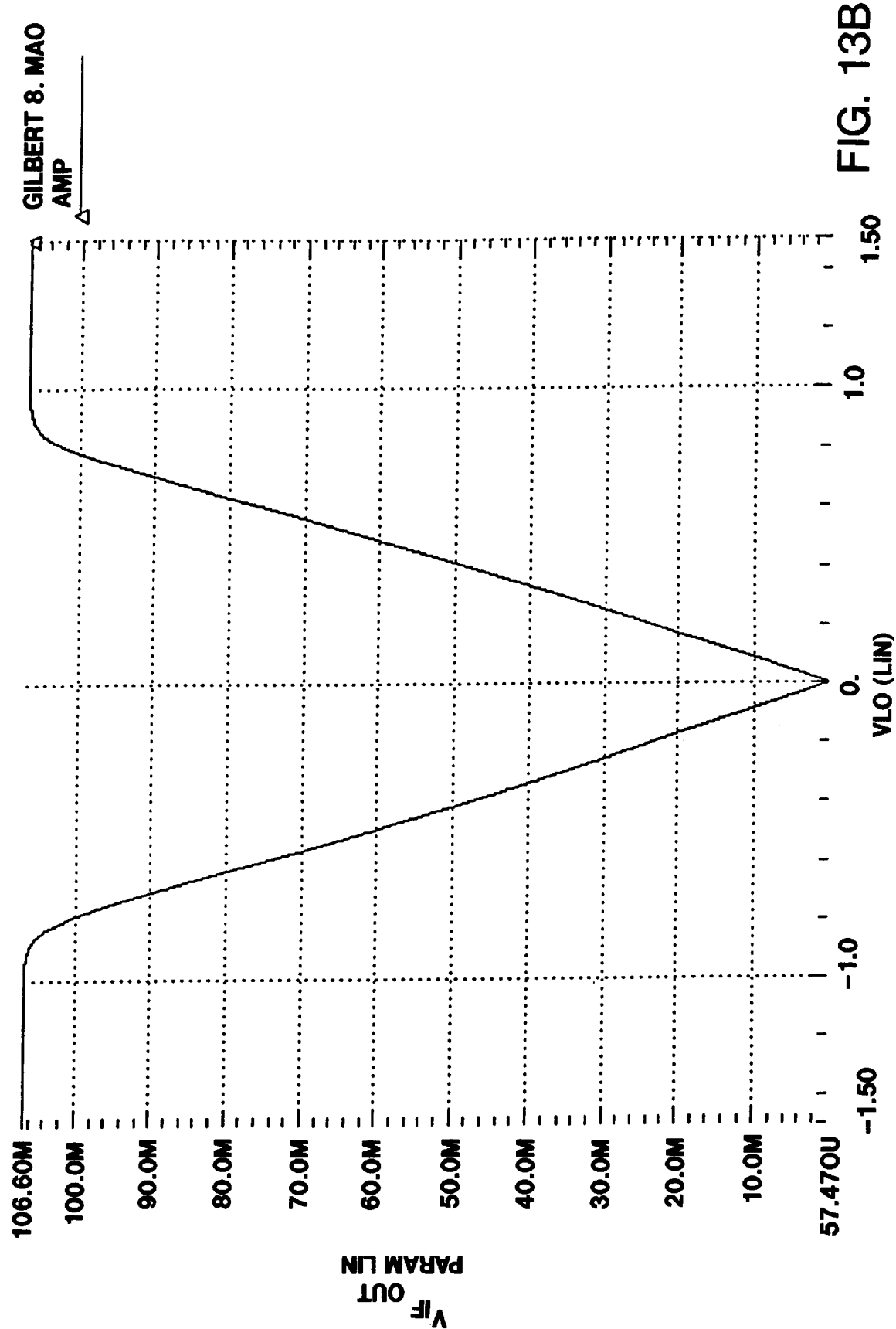
FIG. 13B is a graphical illustration of the linear output voltage as a function of the modulated input voltage where the circuit illustrated in FIG. 13A.
Figure 13C:
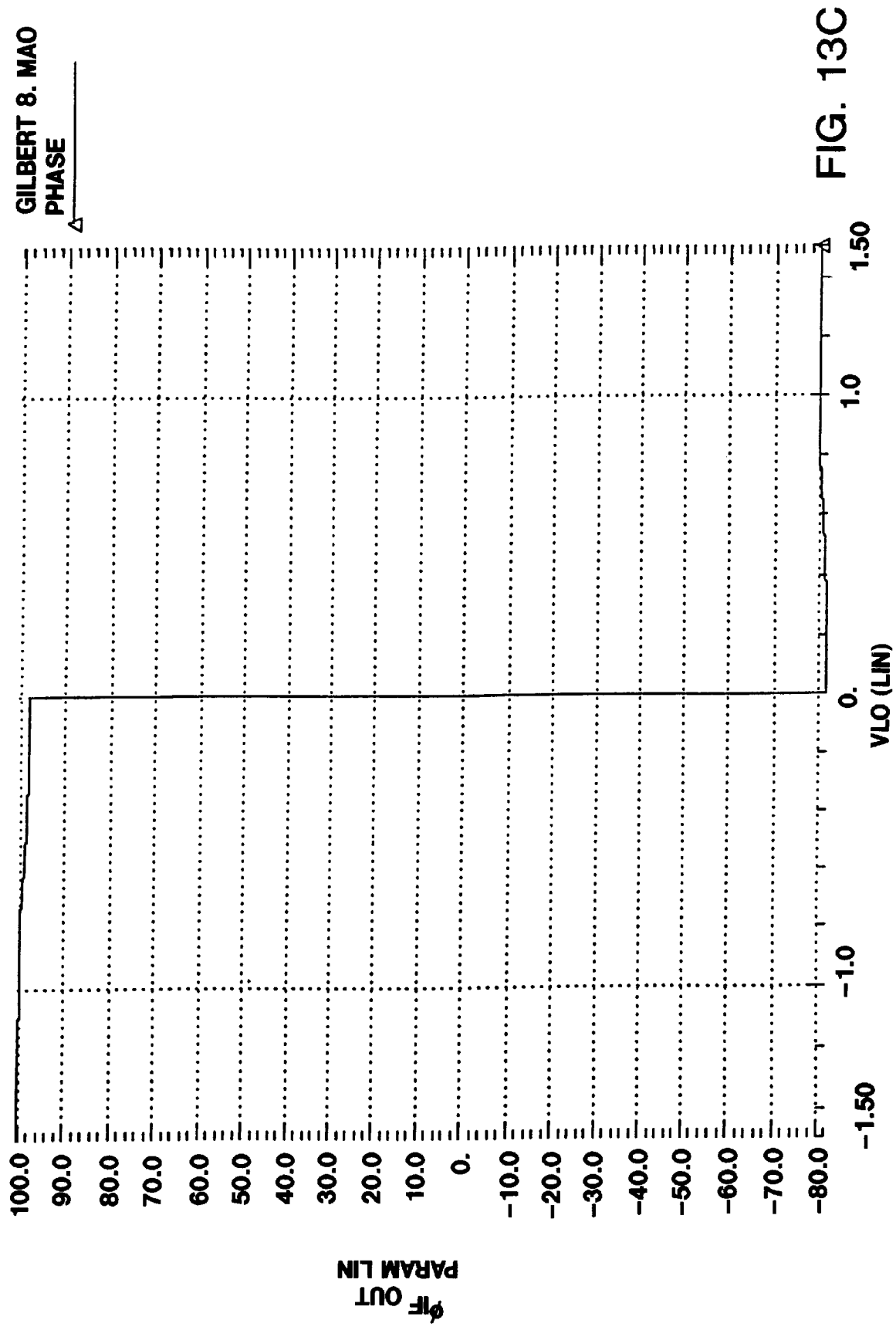
FIG. 13C is a graphical illustration of the dynamic phase transition characteristic for the circuit illustrated in FIG. 13A.
Figure 13D:
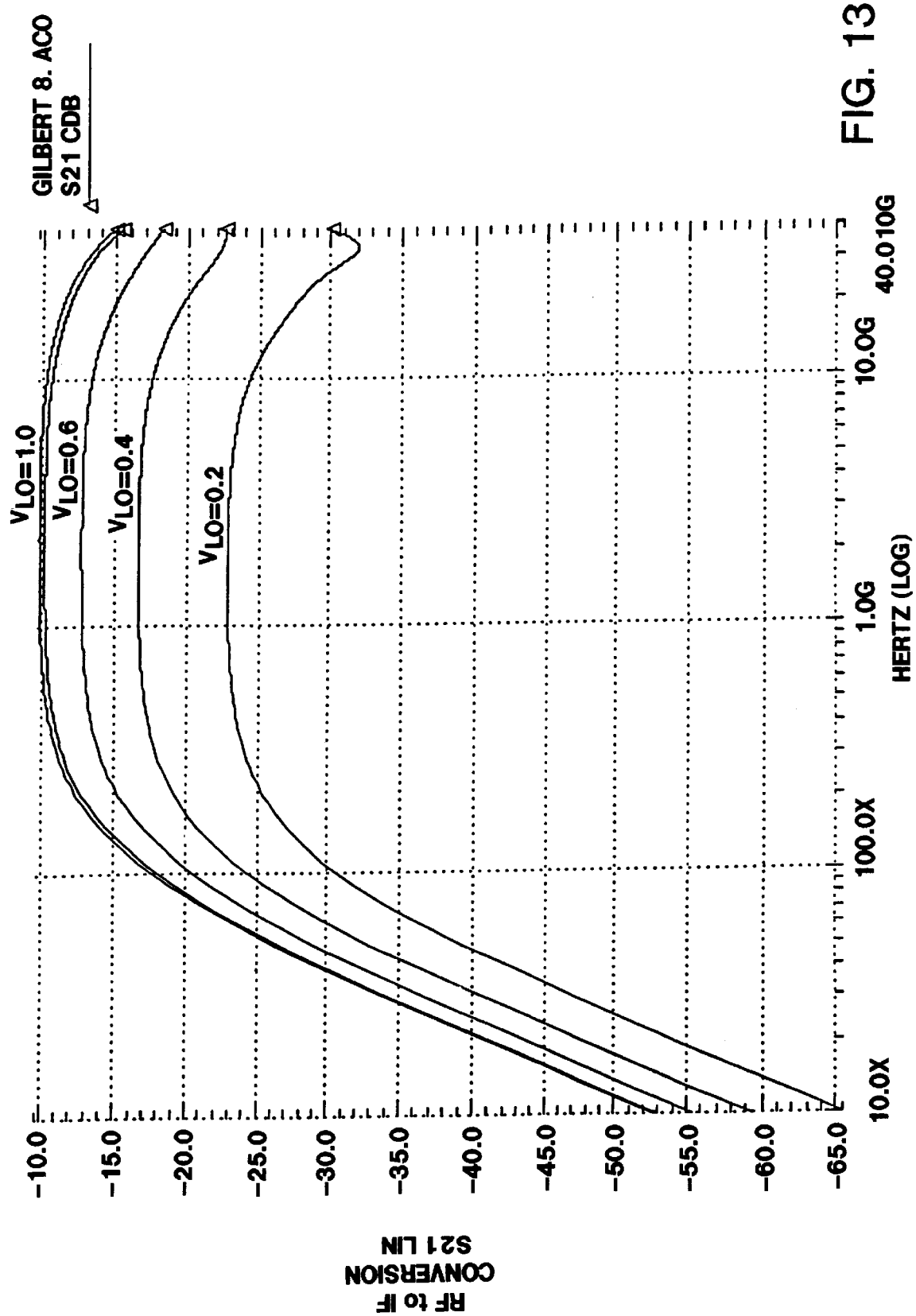

FIG. 13A is a schematic diagram of a conventional predistorted Gilbert cell mixer in a VAP application. FIGS. 13B, 13C and 13D represent the linear output voltages as a function of modulated input voltage characteristics; dynamic phase transition characteristics and broadband conversion gain for various LO dc input voltage amplitude for the circuit illustrated in FIG. 13A.

Figure 14A:
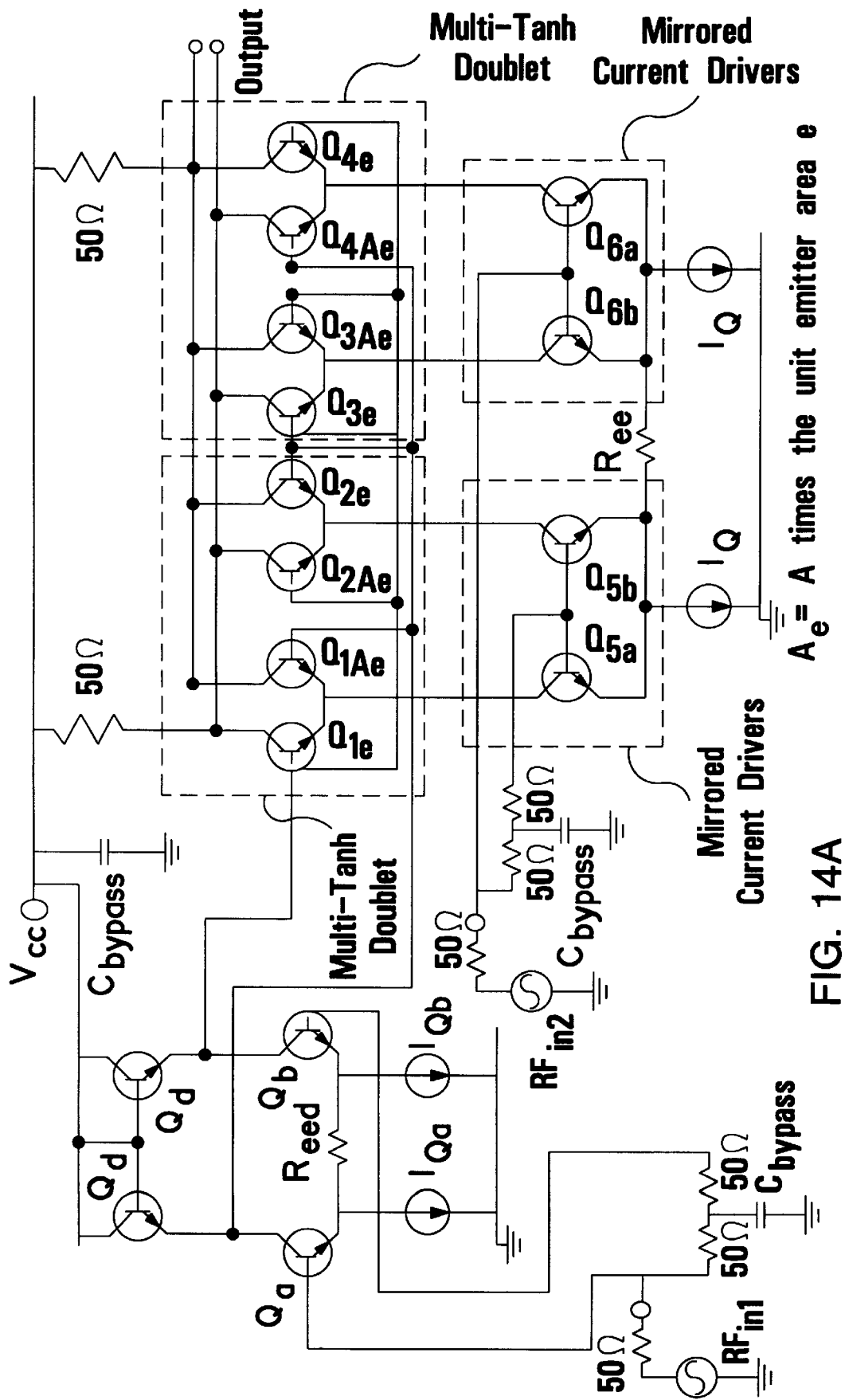
FIG. 14A is a schematic representation of a predistorted integrated multi-tanh linearized Gilbert cell implemented as a VAP in accordance with the present invention.
Figure 14B:
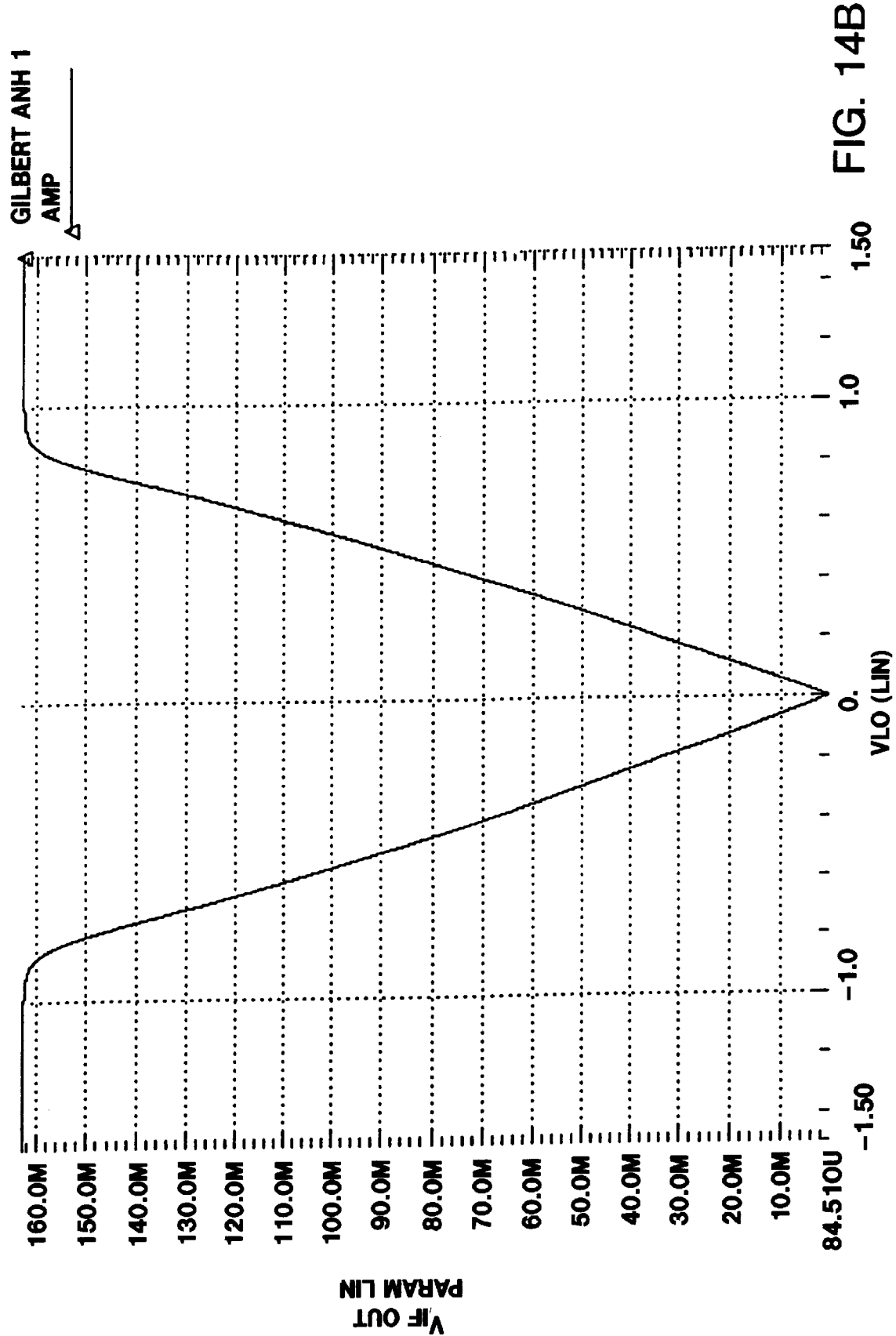
FIG. 14B is a graphical illustration of the output voltage as a function of the modulated input voltage for the circuit illustrated in 14A.
Figure 14C:
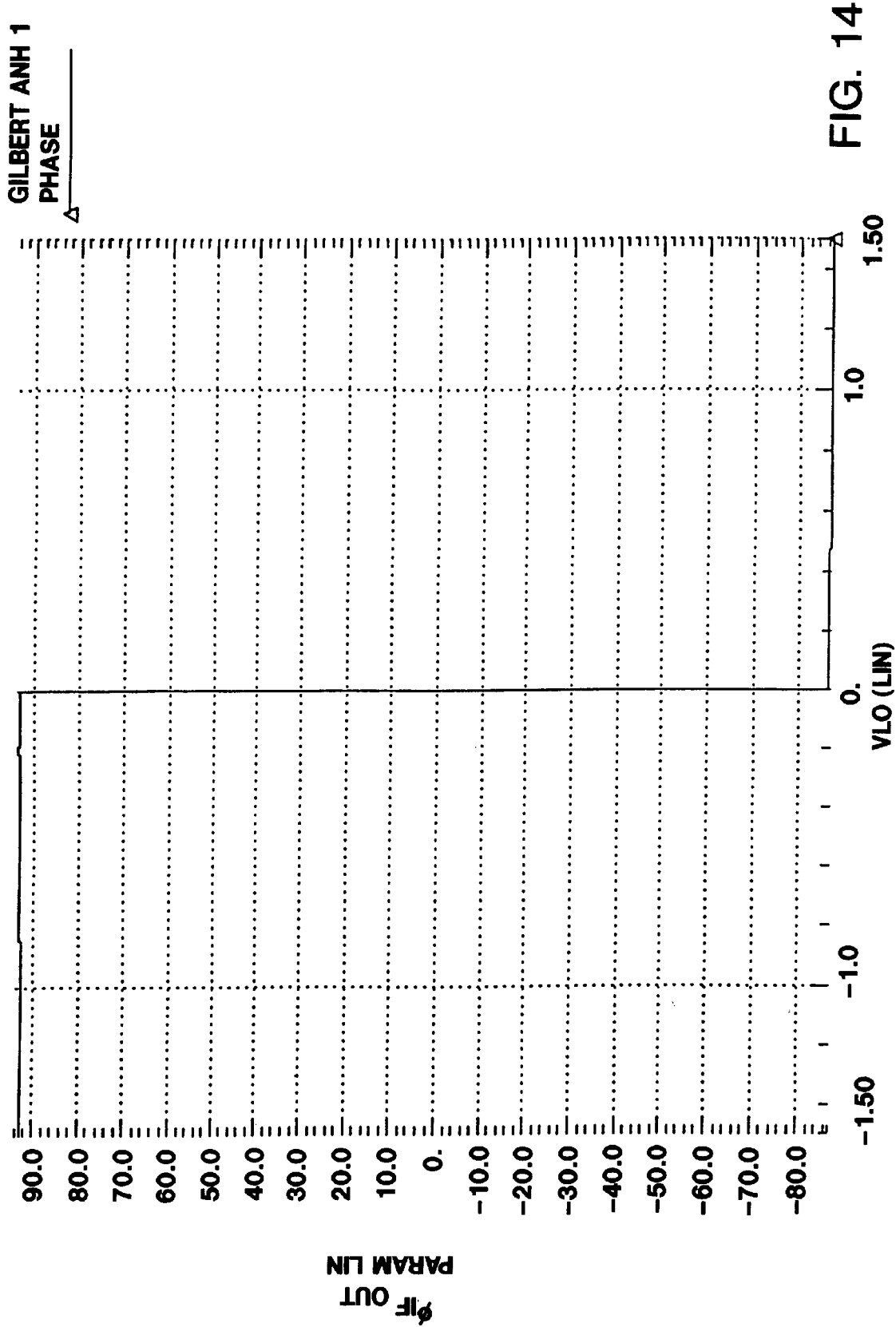
FIG. 14C is a graphical illustration of the dynamic phase transition characteristics of the circuit illustrated in FIG. 14A.
Figure 14D:
FIG. 14D is a graphical illustration of the broadband conversion gain for the various LO dc input amplitudes for the circuit illustrated in FIG. 14A.

FIG. 14A is a schematic diagram of a practical application of a predistorted multi-tanh linearized (i.e. area=4) Gilbert cell multiplier topology for use as a VAP in accordance with an alternate embodiment of the present invention. FIGS. 14B, 14C and 14D illustrate the linear output voltage as a function input voltage characteristics; dynamic phase transition characteristics; and broadband conversion gain for various LO dc input voltage amplitudes.

By comparing FIGS. 13B and 14B, the output voltage $V_{IF}$ as a function of the input amplitude linearity range $V_{LO}$ of the multi-tanh linearized Gilbert cell it is clear that the transistor quad can obtain a similar linear input voltage range relative to the classic predistorted linearized Gilbert cell, but with greater gain. This data can also be interpreted as an improvement in the dynamic range or linearity since gain can be traded off for increased input linear range. However, FIGS. 13C and 14C illustrate that the same dynamic phase response of the multi-tanh topology may be able to obtain less residual phase distortion. FIGS. 13D and 14D illustrate the conversion gain from the IF output to the RF input for various $V_{LO}$ modulation voltage levels. These curves suggest that the broadband response is not significantly degraded by the utilization of additional transistors in the multi-tanh doublets utilized in the improved Gilbert cell topology in accordance with the present invention.

As shown above, utilizing conventional diode predistortion circuitry, the upper input port formed from the multi-tanh doublets can be further linearized with a linear input range exceeding that of a predistortion circuit and conventional Gilbert cell combination. The multi-tanh topology provides improved results relative to conventional predistortion and emitter degeneration techniques such as, smaller size implementation; lower dc power consumption; lower noise; and better dynamic phase linearity response.

The improved Gilbert cell topology in accordance with the present invention can be biased tuned as well as temperature compensated because of its bias dependence nature. The multi-tanh triplet embodiment can offer another degree of freedom for tuning the linearity of the modified Gilbert cell by providing electronic control of the additional current sources provided by the additional transistor comprising the triplet.

There are also processing advantages to the improved Gilbert topologies in accordance with the present invention. In particular, the circuits in accordance the present invention can be fabricated using known bipolar technology and can also be fabricated using three terminal devices or a combination of three devices such as high electron mobility transistors (HEMT) and heterojunction bipolar transistors (HBT). In addition, the improved Gilbert cell topology can economically be monolithically integrated on a chip. The performance of such a monolithically integrated circuit relies on transistor matching characteristics which are known to be very repeatable in bipolar and advanced HBT structures and thus can be mass produced in high volume with excellent performance repeatability.

Obviously, many modifications and variations of the present invention are possible in light of the above teachings. Thus, it is to be understood that, within the scope of the appended claims, the invention may be practiced otherwise than as specifically described above.

What is desired to be secured and claimed by a Letters Patent is:

1. A mixer for providing an increased linear range the mixer comprising:
   multiple input ports;
   multiple output ports;
   a plurality of multi-tanh triplets; and
   a current source driver coupled to each of said multi-tanh triplets.

2. The mixer as recited in claim 1 wherein each of said triplets includes two pairs differentially connected common emitter transistors and an additional common emitter transistor.

3. The mixer as recited in claim 2, further including an additional current source driver connected to said additional common emitter transistor.

4. The mixer as recited in claim 3, wherein said current source drivers are implemented as BJT transistors.

5. The mixer as recited in claim 4, wherein each of said current source drivers includes a pair of differentially connected common emitter transistors having an emitter area e, wherein the emitter area of the additional current source drivers is selected as a multiple K of the emitter area e.

6. The mixer as recited in claim 5, wherein said multiple K is selected to optimize the biasing current for said additional common emitter transistors.

7. The mixer as recited in claim 1, further including an emitter degeneration resistor connected between said current source drivers.

8. A bilinear multiplier comprising:
   a pair of input ports;
   at least one output port; and
   means for providing an output signal at said least one output port which is linearly related to the inputs at said input ports, said providing means including a pair of multi-tanh doublets and a pair of current source drivers and an emitter degeneration resistor connected between said current source drivers.

9. The bilinear multiplier as recited in claim 8 wherein each doublet includes two pair differentially connected common emitter transistors.

10. The bilinear multiplier as recited in claim 9, wherein the transistors have emitter areas e and Ae, where Ae=A times the emitter area e.

11. The bilinear multiplier as recited in claim 10, wherein A is selected to optimize the linear input voltage range of the doublet.

12. The bilinear multiplier as recited in claim 11 wherein A is >1.

13. The bilinear multiplier as recited in claim 12, wherein A is approximately equal to 3.7.

* * * * *